US012700831B2

(12) United States Patent
Qian et al.

(10) Patent No.: US 12,700,831 B2
(45) Date of Patent: Aug. 4, 2026

(54) POWER SUPPLY CIRCUIT FOR POWER AMPLIFIER AND COMMUNICATION APPARATUS

(71) Applicant: Huawei Technologies Co., Ltd., Shenzhen (CN)

(72) Inventors: Yao Qian, Shanghai (CN); Weinan Li, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 297 days.

(21) Appl. No.: 18/496,542

(22) Filed: Oct. 27, 2023

(65) Prior Publication Data

US 2024/0056032 A1 Feb. 15, 2024

Related U.S. Application Data

(63) Continuation of application No. PCT/CN2021/091573, filed on Apr. 30, 2021.

(51) Int. Cl.
| | |
|---|---|
| *H03F 1/02* | (2006.01) |
| *G05F 1/00* | (2006.01) |
| *G05F 1/46* | (2006.01) |
| *H03F 3/24* | (2006.01) |

(52) U.S. Cl.
CPC .......... *H03F 1/0233* (2013.01); *H03F 3/245* (2013.01); *H03F 2200/105* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 8,792,840 B2 | 7/2014 | Khlat et al. |
| 8,947,161 B2 | 2/2015 | Khlat et al. |
| 9,020,451 B2 | 4/2015 | Khlat |
| 9,065,505 B2 | 6/2015 | Levesque |
| 9,197,162 B2 | 11/2015 | Chiron et al. |

(Continued)

FOREIGN PATENT DOCUMENTS

| | | |
|---|---|---|
| CN | 101507104 A | 8/2009 |
| CN | 105896959 A | 8/2016 |

(Continued)

OTHER PUBLICATIONS

US 9,882,534 B2, 01/2018, Khlat (withdrawn)

*Primary Examiner* — Pablo N Tran
(74) *Attorney, Agent, or Firm* — Slater Matsil, LLP

(57) ABSTRACT

In accordance with an embodiment, a power supply circuit configured to be coupled to a power amplifier that includes a driving-stage power amplifier and an output-stage power amplifier. The power amplifier is configured to amplify a power of a radio frequency signal, the driving-stage power amplifier is configured to receive the radio frequency signal, and the output-stage power amplifier is configured to receive a radio frequency signal amplified by the driving-stage power amplifier. The power supply circuit includes: a charge pump configured to supply power to the driving-stage power amplifier; and an envelope tracker configured to supply power to the output-stage power amplifier, wherein the charge pump and the envelope tracker are configured to supply power to the power amplifier.

20 Claims, 18 Drawing Sheets

(56) References Cited

U.S. PATENT DOCUMENTS

| | | | |
|---|---|---|---|
| 9,207,692 B2 | 12/2015 | Khlat et al. | |
| 9,247,496 B2 | 1/2016 | Khlat | |
| 9,263,996 B2 | 2/2016 | Folkmann et al. | |
| 9,294,041 B2 | 3/2016 | Khlat et al. | |
| 9,298,198 B2 | 3/2016 | Kay et al. | |
| 9,379,667 B2 | 6/2016 | Khlat et al. | |
| 9,479,118 B2 * | 10/2016 | Khlat ................... | H03F 1/0227 |
| 9,516,693 B2 | 12/2016 | Khlat et al. | |
| 9,584,071 B2 | 2/2017 | Khlat | |
| 9,595,981 B2 | 3/2017 | Khlat | |
| 9,614,476 B2 | 4/2017 | Khlat | |
| 9,634,620 B2 | 4/2017 | Khlat et al. | |
| 9,853,608 B2 | 12/2017 | Retz et al. | |
| 9,912,297 B2 | 3/2018 | Khlat | |
| 9,973,147 B2 | 5/2018 | Khlat | |
| 10,069,470 B2 | 9/2018 | Khlat et al. | |
| 10,080,190 B2 | 9/2018 | Khlat | |
| 10,122,323 B2 | 11/2018 | Khlat et al. | |
| 10,158,329 B1 | 12/2018 | Khlat | |
| 10,158,330 B1 | 12/2018 | Khlat | |
| 11,218,116 B2 * | 1/2022 | Ng ........................... | H04B 1/04 |
| 11,539,330 B2 * | 12/2022 | Khlat ........................ | H03F 3/19 |
| 2013/0141068 A1 * | 6/2013 | Kay ........................ | H02M 1/14 |
| | | | 323/282 |
| 2013/0328613 A1 | 12/2013 | Kay et al. | |
| 2017/0005619 A1 | 1/2017 | Khlat | |
| 2018/0048276 A1 | 2/2018 | Khlat et al. | |
| 2018/0309409 A1 | 10/2018 | Khlat | |
| 2019/0243403 A1 | 8/2019 | Gebeyehu et al. | |
| 2020/0228063 A1 | 7/2020 | Khlat | |

FOREIGN PATENT DOCUMENTS

| | | |
|---|---|---|
| CN | 106533461 A | 3/2017 |
| CN | 110277963 A | 9/2019 |
| CN | 110518794 A | 11/2019 |

* cited by examiner

Path

POWER SUPPLY CIRCUIT FOR POWER AMPLIFIER AND COMMUNICATION APPARATUS

CROSS-REFERENCE TO RELATED APPLICATIONS

This application is a continuation of International Application No. PCT/CN2021/091573, filed on Apr. 30, 2021, the disclosure of which is hereby incorporated by reference in its entirety.

TECHNICAL FIELD

This application relates to the communication field, and in particular, to a power supply circuit for a power amplifier and a communication apparatus.

BACKGROUND

In a radio frequency communication system, an output end of a radio frequency transmitter is coupled to an input end of a power amplifier (PA). The PA is configured to amplify power of a radio frequency signal output by the radio frequency transmitter.

Currently, power supply of the PA is a main source of power consumption of the communication system.

SUMMARY

Embodiments of this application provide a power supply circuit for a power amplifier and a communication apparatus, to improve efficiency of the power supply circuit of the PA.

According to a first aspect, a power supply circuit for a power amplifier is provided, including a charge pump and an envelope tracker. The charge pump and the envelope tracker are configured to supply power to the power amplifier. The power amplifier is configured to amplify power of a radio frequency signal. The power amplifier includes a driving-stage power amplifier and an output-stage power amplifier. The driving-stage power amplifier is configured to input the radio frequency signal, and the output-stage power amplifier is configured to input a radio frequency signal amplified by the driving-stage power amplifier. The charge pump is configured to supply power to the driving-stage power amplifier. The envelope tracker is configured to supply power to the output-stage power amplifier. According to the power supply circuit provided in this embodiment of this application, in a plurality of cascaded power amplifiers, an output-stage power amplifier consumes a largest current, and a driving-stage power amplifier consumes a current of only tens of micro-amperes. Therefore, in general, a power supply voltage of the output-stage power amplifier is dynamically regulable, and a power supply voltage of the driving-stage power amplifier is fixed. Because a charge pump has a theoretical efficiency of 100% and has a very small actual loss, in the power supply circuit, using the charge pump to supply power to the driving-stage power amplifier can improve efficiency of both the driving-stage power amplifier and the power supply circuit.

In a possible implementation, the envelope tracker includes a switch circuit and an envelope amplifier. The switch circuit is configured to output a low-frequency power component to the output-stage power amplifier. The envelope amplifier is configured to output a high-frequency power component to the output-stage power amplifier.

Because a proportion of the low-frequency power component of an actual envelope is far greater than that of the high-frequency power component, the switch circuit provides most power of the entire envelope. However, the switch circuit has high efficiency, and therefore, overall efficiency of the envelope tracker can be improved. The envelope amplifier is configured to amplify an input envelope signal by a specific multiple, so that a fast tracking function can be implemented. The switch circuit may be a boost circuit, a buck circuit, or a buck-boost circuit.

In a possible implementation, the power supply circuit further includes an average power tracker. The power supply circuit is configured to select the average power tracker or the envelope tracker to supply power to the output-stage power amplifier. When a signal bandwidth is very small, overall efficiency of the average power tracker and the power amplifier is lower than overall efficiency of the envelope tracker and the power amplifier. However, because efficiency of the envelope tracker decreases with an increase of the signal bandwidth, for a bandwidth of higher than 20 M or 40 M, the overall efficiency of the average power tracker and the power amplifier is generally higher than the overall efficiency of the envelope tracker and the power amplifier. Therefore, one of the average power tracker and the envelope tracker may be selected based on the signal bandwidth to supply power to the output-stage power amplifier, so that overall efficiency of the power supply circuit and the power amplifier can be improved under different signal bandwidths.

In a possible implementation, the charge pump includes a first switch, a second switch, a third switch, a fourth switch, a first capacitor, and a load capacitor. A first end of the second switch, a first end of the load capacitor, and a second end of the third switch are all coupled to an output end of the charge pump. A second end of the second switch is coupled to a first end of the first capacitor and a first end of the first switch. A second end of the first switch is coupled to an input end of the charge pump. A first end of the fourth switch and a second end of the load capacitor are coupled to each other and grounded. A second end of the fourth switch is coupled to a second end of the first capacitor and a first end of the third switch. This implementation provides a charge pump structure in which an output power supply voltage is a half of an input supply voltage.

In a possible implementation, the power supply voltage output by the charge pump is one-(N+1)th of the input voltage. The charge pump includes a plurality of switches, N capacitors, and the load capacitor, where N is a positive integer. The first end of the load capacitor is configured to output a power supply voltage, and the second end of the load capacitor is grounded. In a charging stage, the plurality of switches operate to enable a first end of a first path formed after the N capacitors are connected in series to be coupled to the first end of the load capacitor, and enable a supply voltage to be input to a second end of the first path. In a discharging stage, the plurality of switches operate to disconnect the supply voltage, enable a first end of a second path formed after the N capacitors are connected in parallel to be coupled to the first end of the load capacitor, and enable a second end of the second path to be grounded.

In a possible implementation, the voltage output by the charge pump is N/(N+1)th of the input voltage. The charge pump includes a plurality of switches, N capacitors, and the load capacitor, where N is a positive integer. The first end of the load capacitor is configured to output a power supply voltage, and the second end of the load capacitor is grounded. In a charging stage, the plurality switches operate to enable a first end of the first path formed after the N capacitors are connected in parallel to be coupled to the first end of the load capacitor, and enable a supply voltage to be input to the second end of the first path. In a discharging stage, the plurality of switches operate to disconnect the supply voltage, enable a first end of the second path formed after the N capacitors are connected in series to be coupled to the first end of the load capacitor, and enable the second end of the second path to be grounded.

In a possible implementation, the power supply circuit may further include a power supply module, for example, an LDO or a DC-DC. The power supply module is coupled between the charge pump and the driving-stage power amplifier. By using the power supply module, a voltage output by the charge pump may be further flexibly regulated and then provided to the driving-stage power amplifier, so that flexibility of power supply is improved.

According to a second aspect, a communication apparatus is provided, including the power supply circuit according to the first aspect and any one of the implementations of the first aspect, a transmitter, a power amplifier, and a digital baseband processor. The digital baseband processor is coupled to the transmitter. The transmitter is configured to output a radio frequency signal to the power amplifier. The power supply circuit is configured to supply power to the power amplifier.

In a possible implementation, the power amplifier includes a third capacitor, a resistor, an inductor, and a triode. A base of the triode inputs the radio frequency signal by using the third capacitor. The base of the triode further inputs a bias voltage by using the resistor. An emitter of the triode is grounded. A collector of the triode inputs a power supply voltage from the power supply circuit by using the inductor. The collector of the triode is further configured to output an amplified radio frequency signal.

In a possible implementation, the communication apparatus further includes a printed circuit board and an antenna. The communication apparatus is fixed on the printed circuit board. The power amplifier transmits the radio frequency signal through the antenna.

For technical effects of any one of the second aspect and the implementations of the second aspect, refer to technical effects of any one of the first aspect and the implementations of the first aspect.

4

Figure 7:
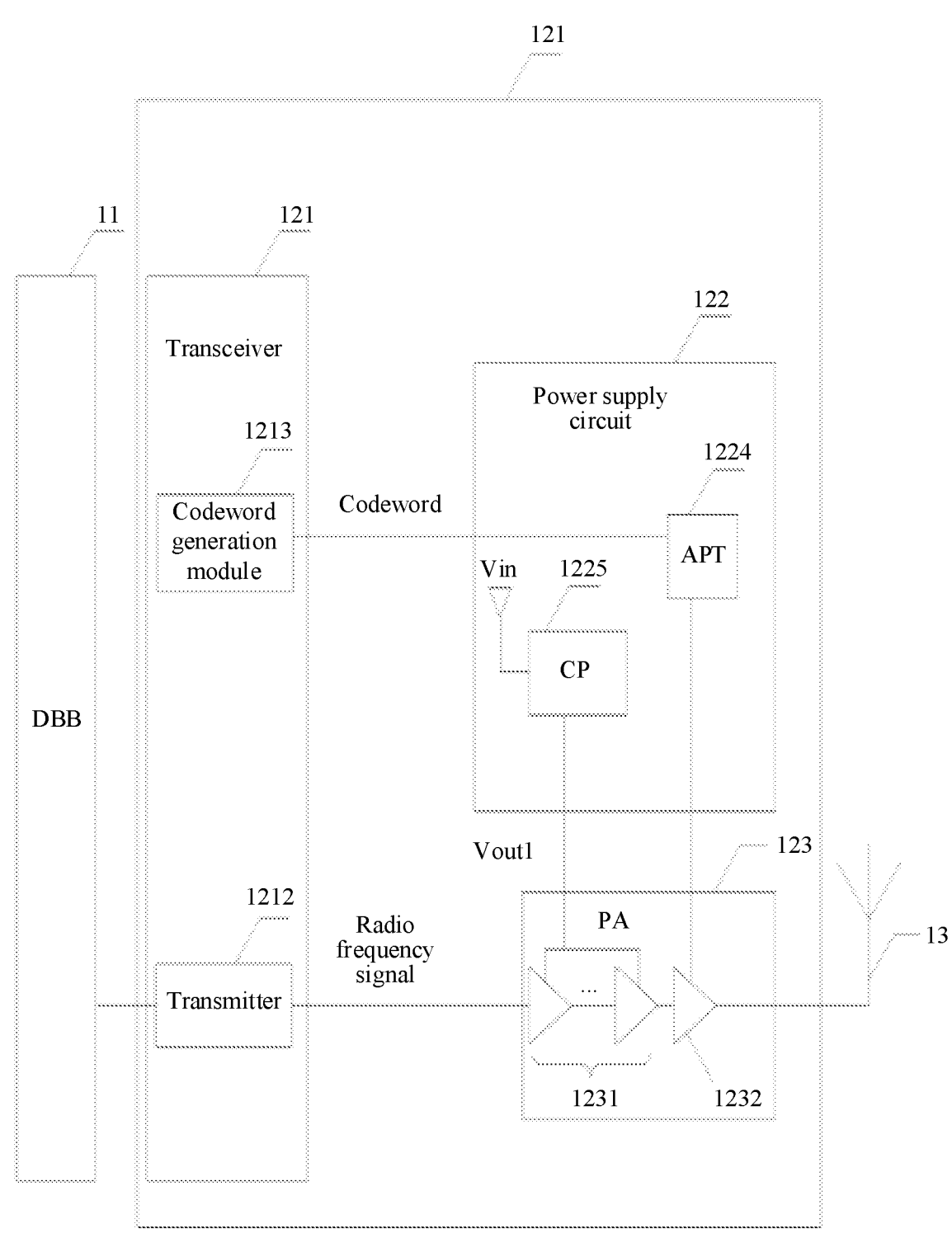
Figure 8:
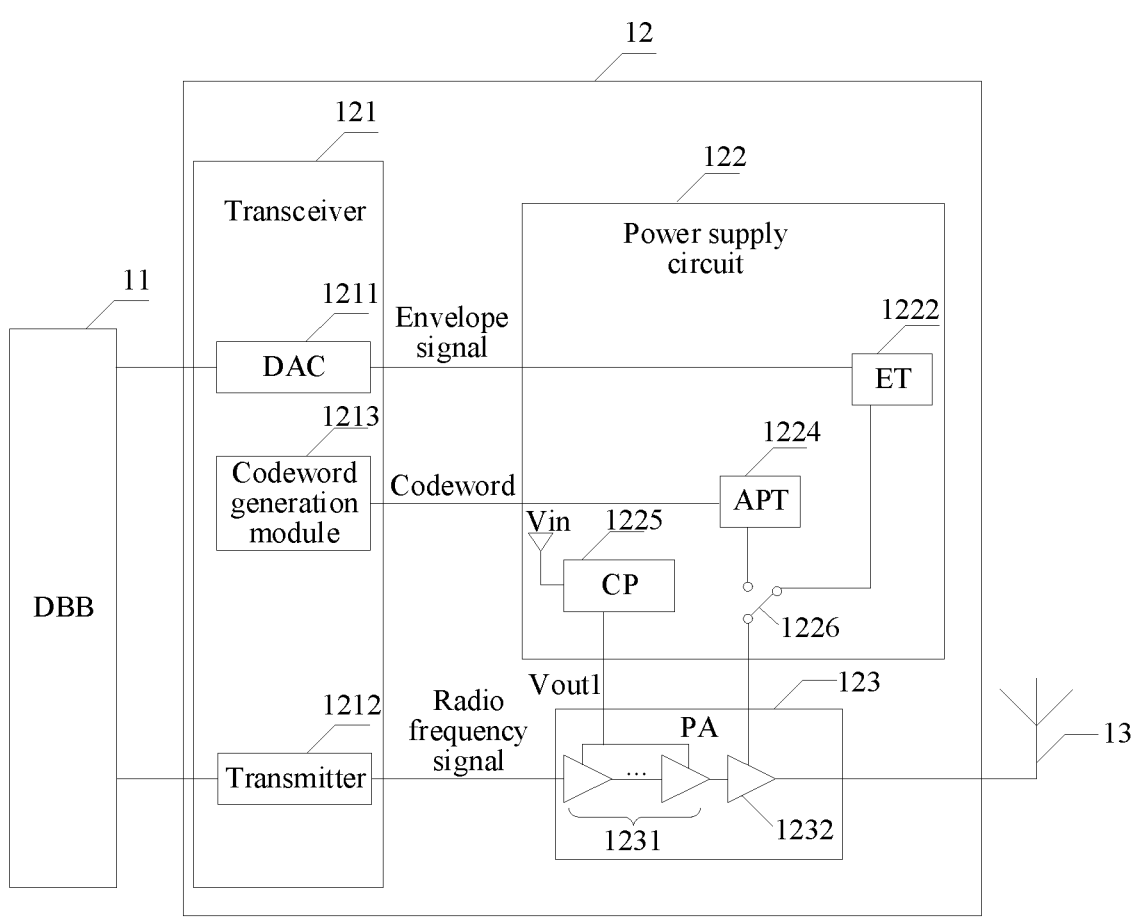
Figure 9:
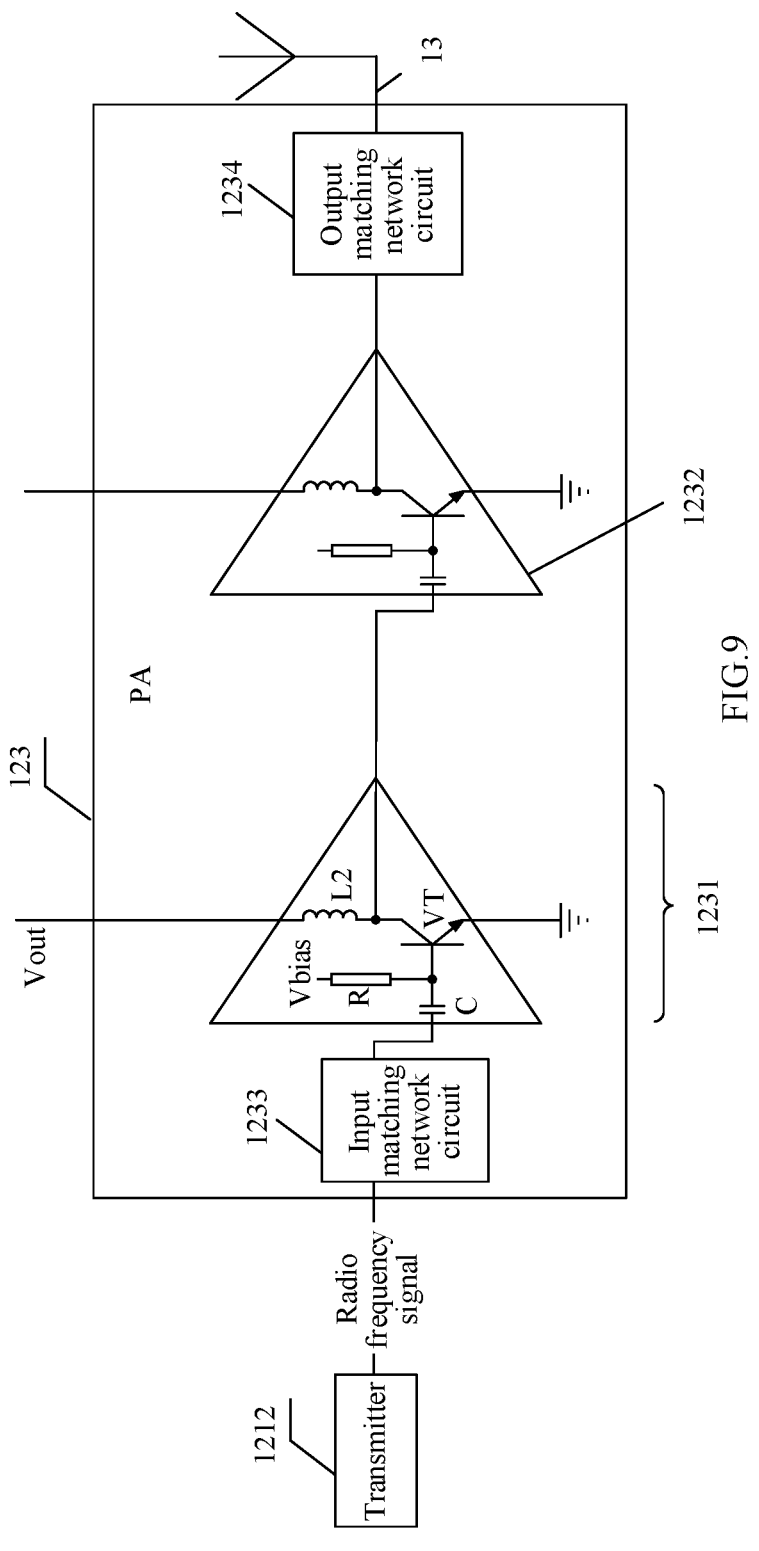
Figure 10:
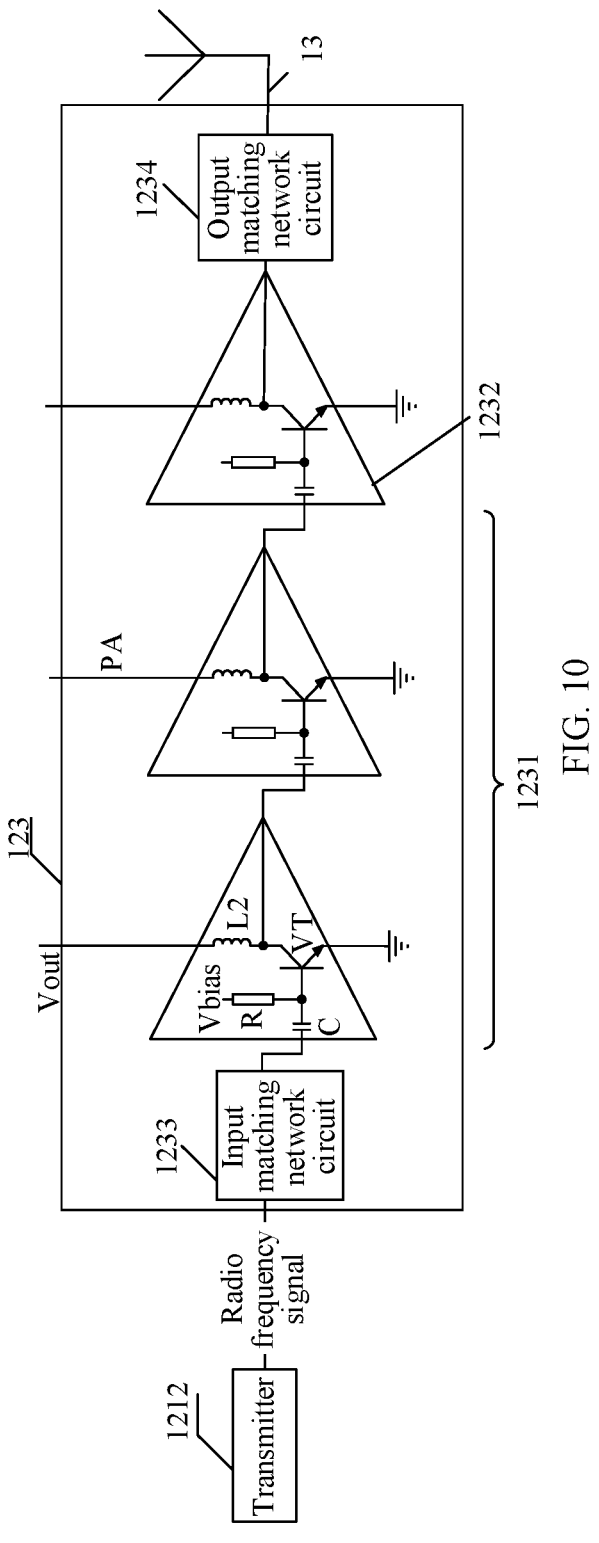
Figure 11:
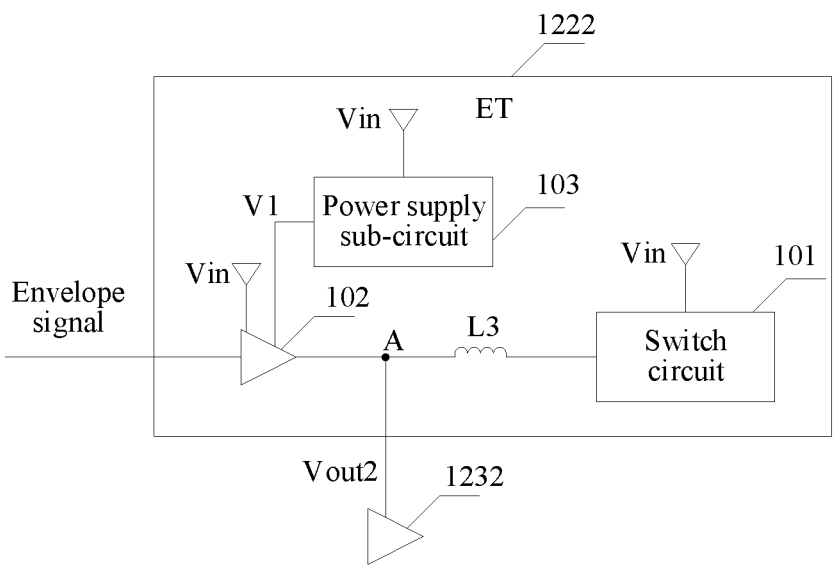
Figure 12:
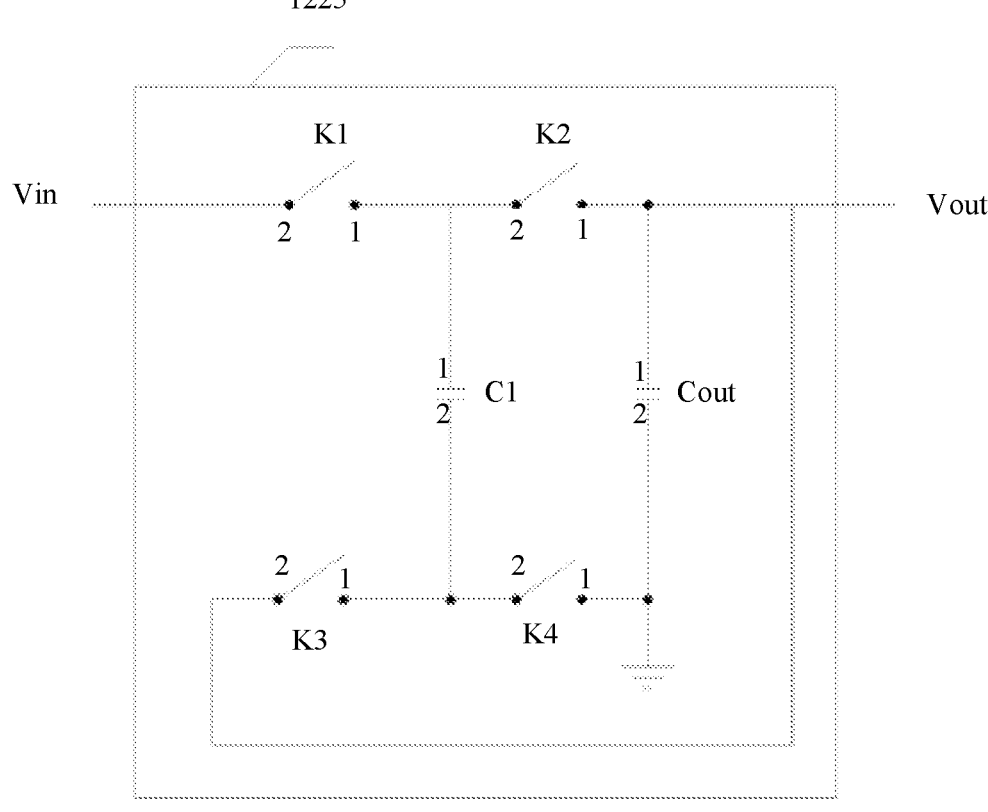
Figure 13:
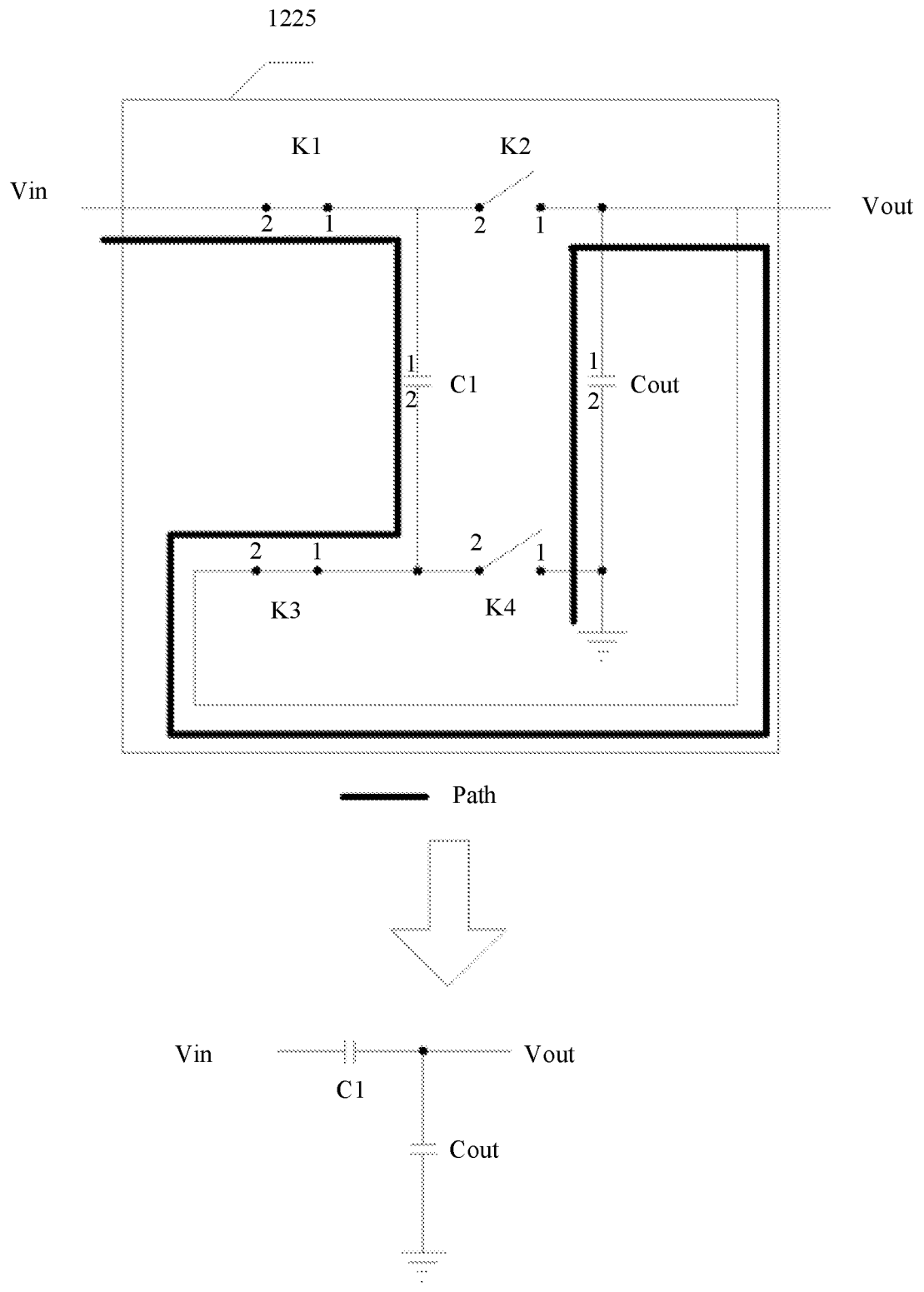
Figure 14:
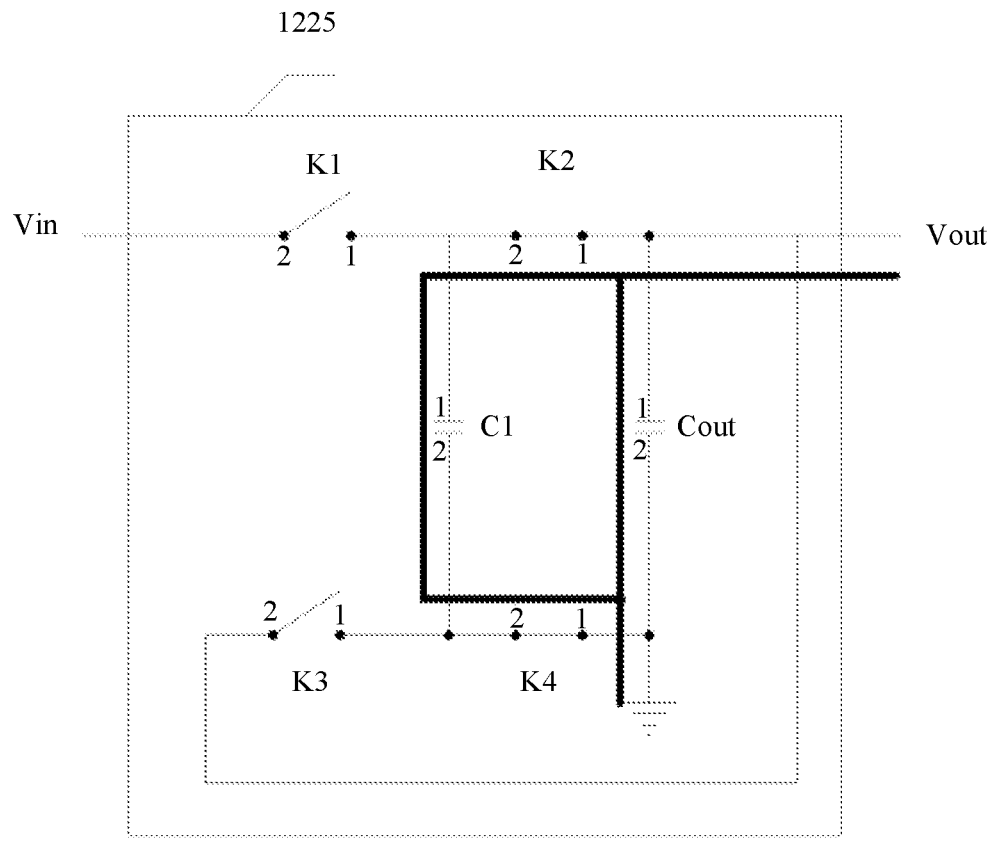
Figure 14:
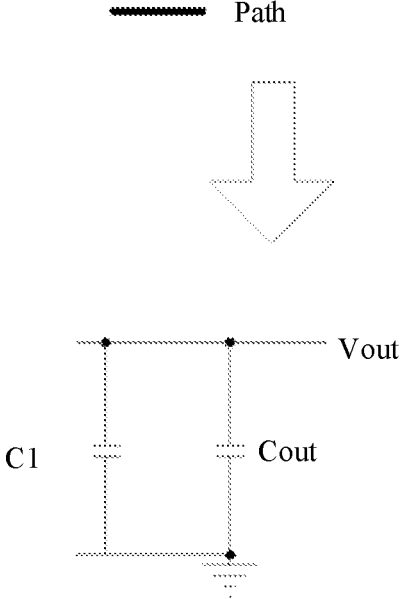
Figure 15:
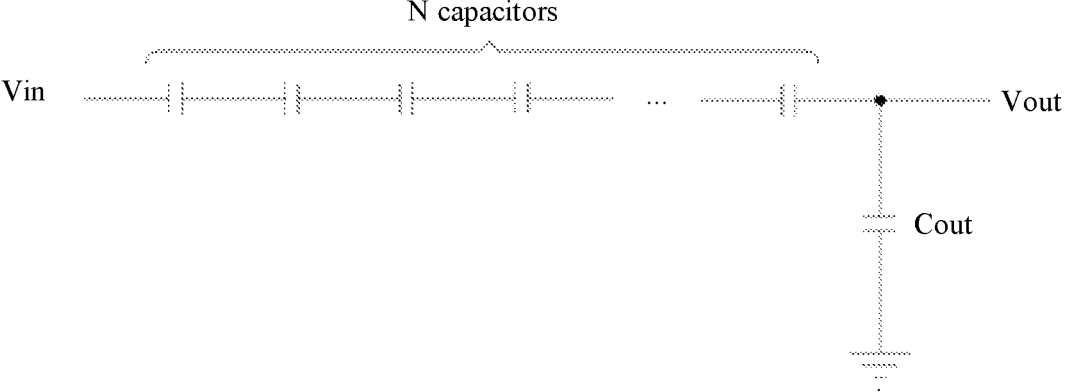
Figure 16:
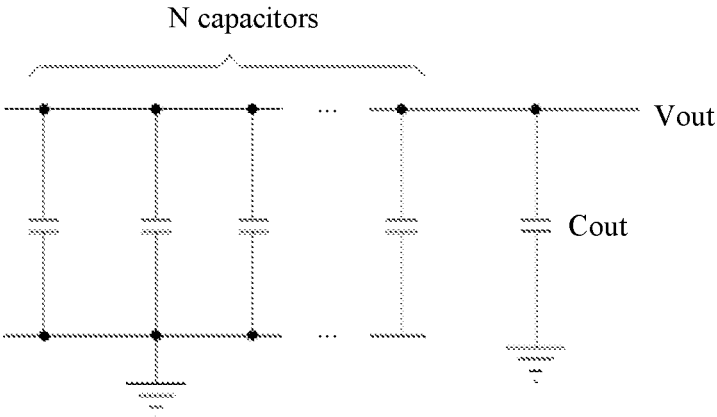
Figure 17:
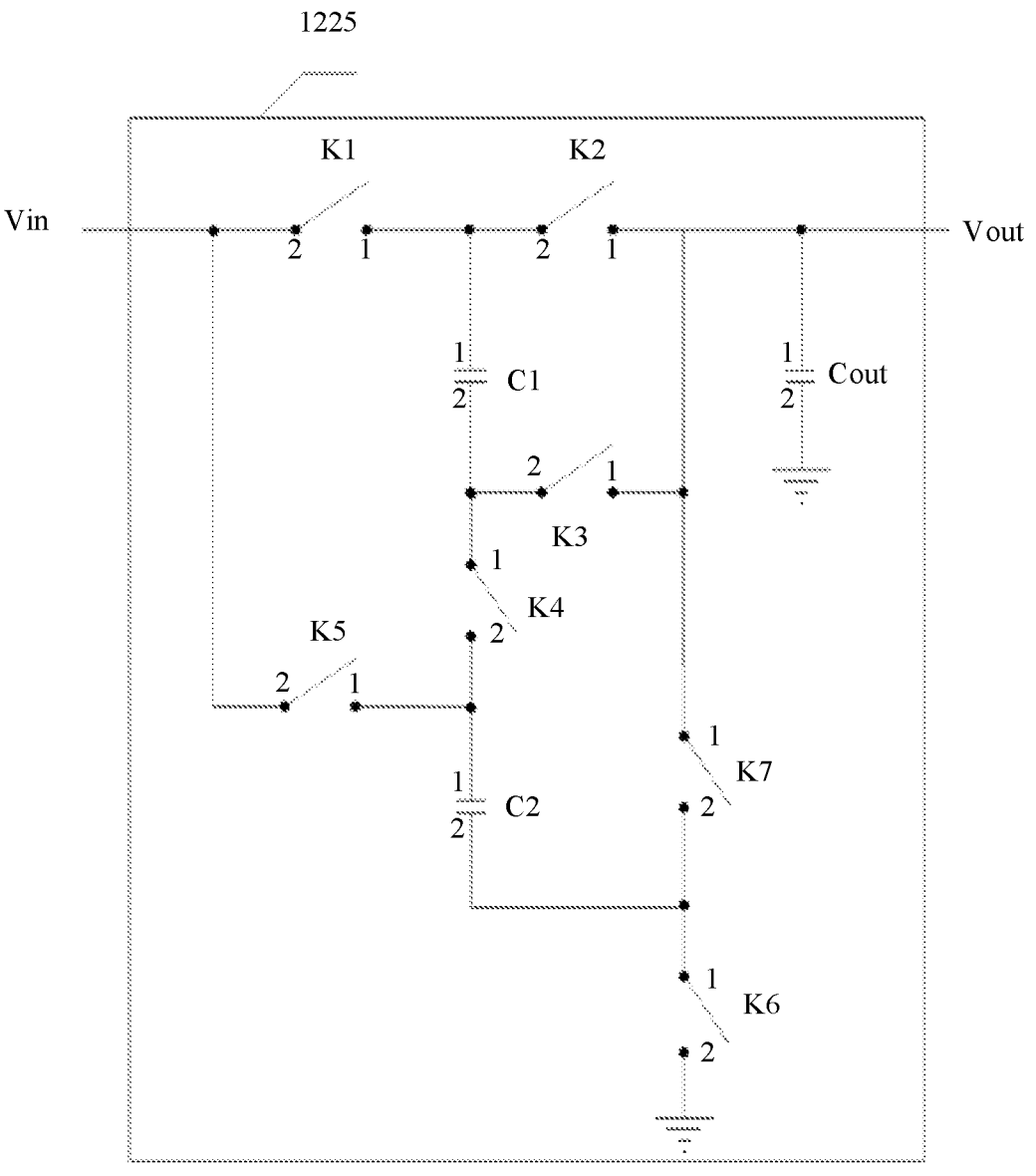
Figure 18:
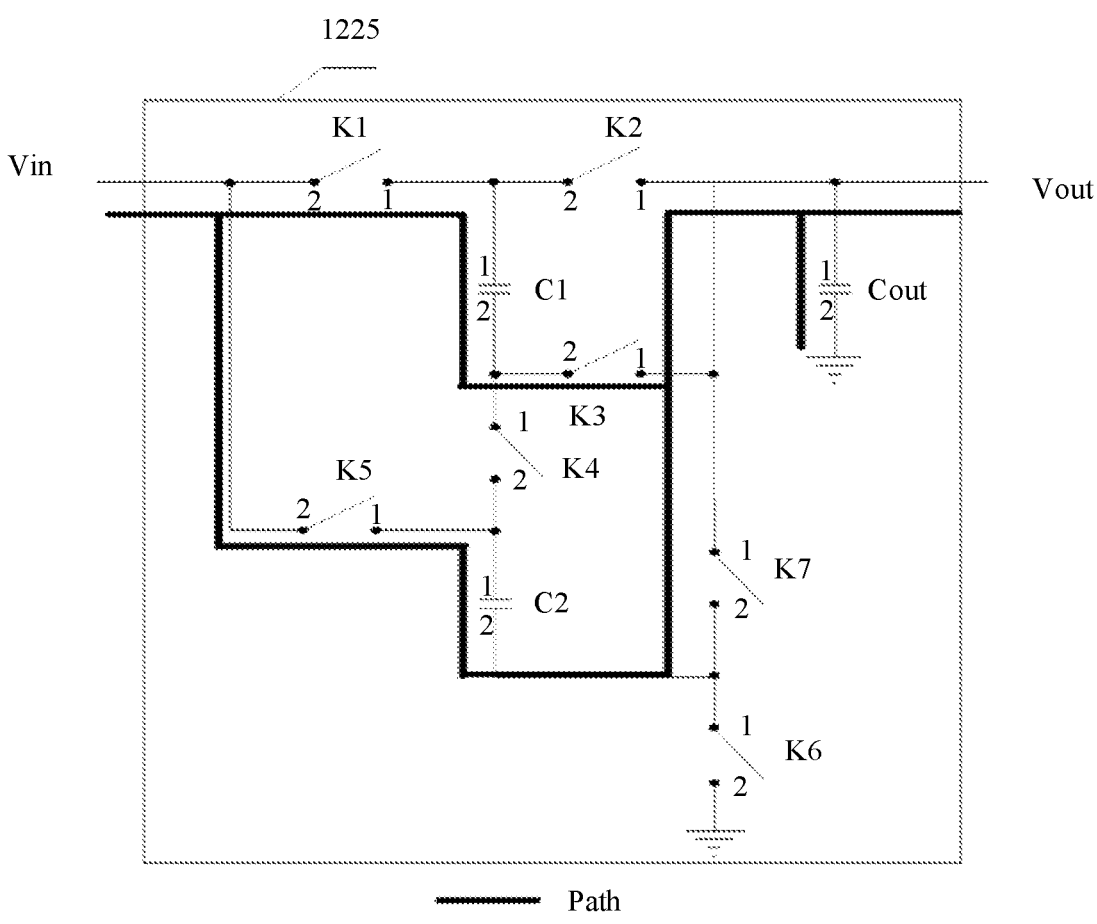
Figure 18:
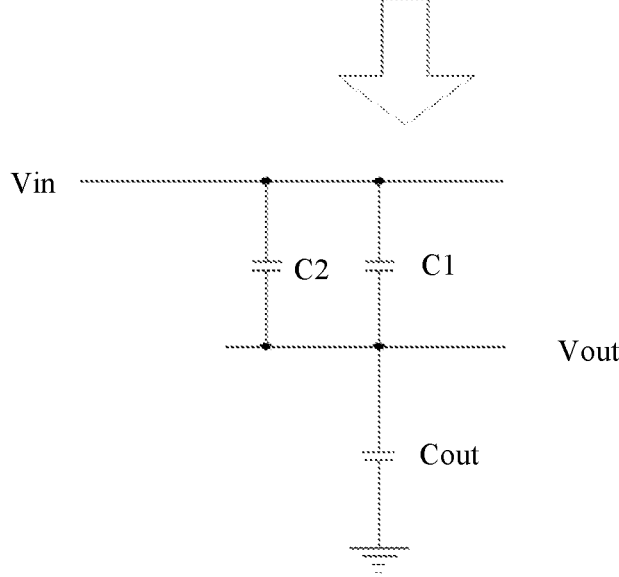
Figure 19:
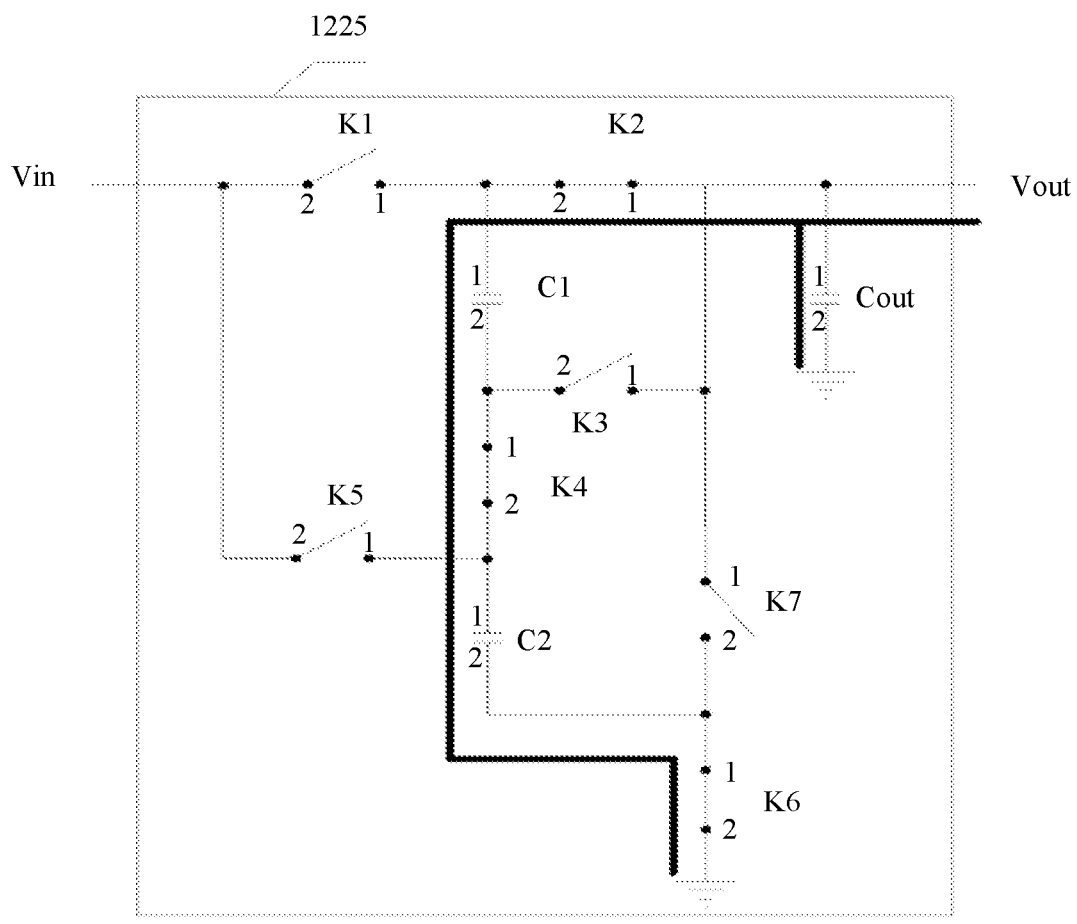
Figure 19:
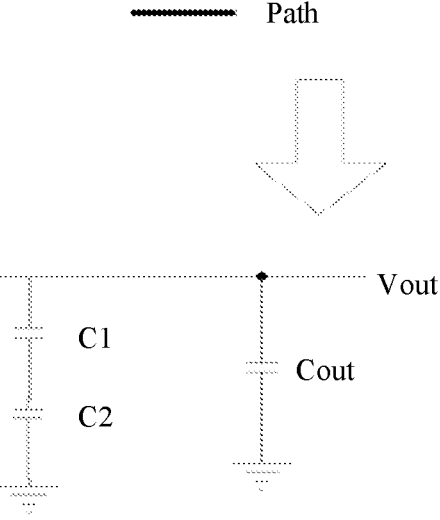
Figure 20:
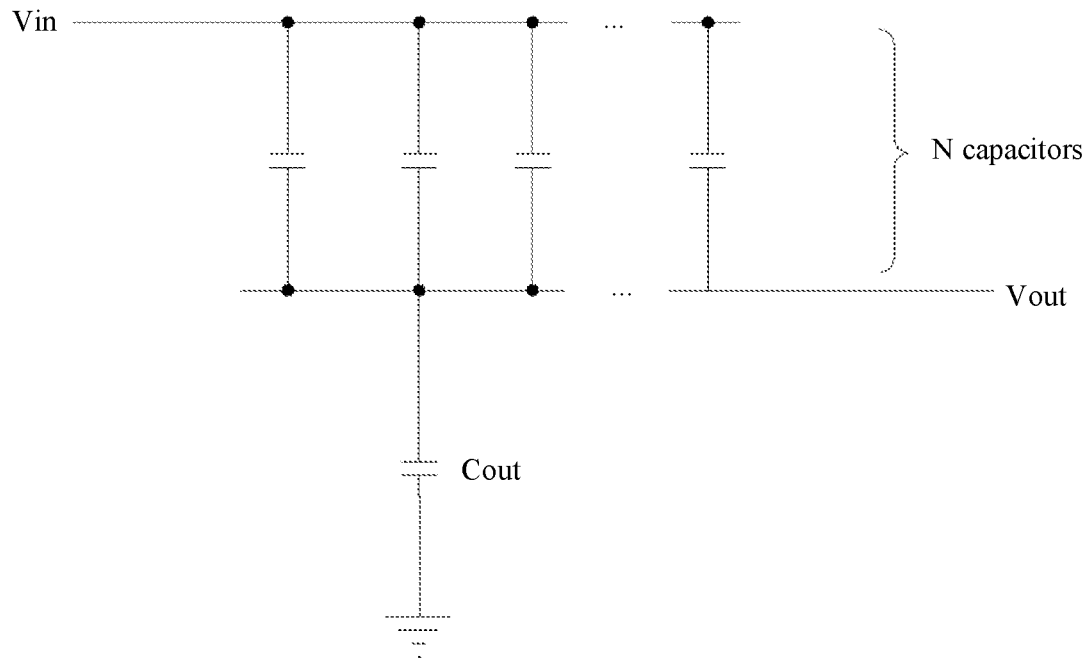
Figure 21:
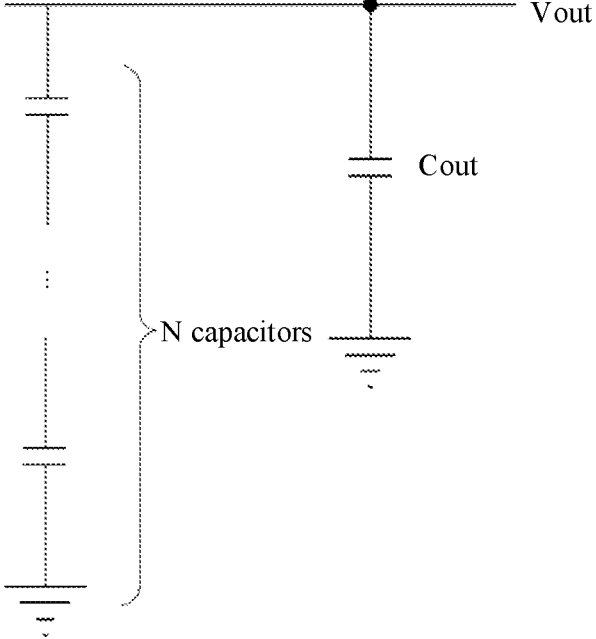

FIG. 7 is a seventh schematic diagram of a structure of an integrated circuit according to an embodiment of this application;

FIG. 8 is an eighth schematic diagram of a structure of an integrated circuit according to an embodiment of this application;

FIG. 9 is a schematic diagram of a structure of a PA according to an embodiment of this application;

FIG. 10 is a schematic diagram of a structure of another PA according to an embodiment of this application;

FIG. 11 is a schematic diagram of a structure of an envelope tracker according to an embodiment of this application;

FIG. 12 is a first schematic diagram of a structure of a charge pump according to an embodiment of this application;

FIG. 13 is a first schematic diagram of an equivalent circuit of a charge pump in a charging stage according to an embodiment of this application;

FIG. 14 is a first schematic diagram of an equivalent circuit of a charge pump in a discharging stage according to an embodiment of this application;

FIG. 15 is a second schematic diagram of an equivalent circuit of a charge pump in a charging stage according to an embodiment of this application;

FIG. 16 is a second schematic diagram of an equivalent circuit of a charge pump in a discharging stage according to an embodiment of this application;

FIG. 17 is a second schematic diagram of a structure of a charge pump according to an embodiment of this application;

FIG. 18 is a third schematic diagram of an equivalent circuit of a charge pump in a charging stage according to an embodiment of this application;

FIG. 19 is a third schematic diagram of an equivalent circuit of a charge pump in a discharging stage according to an embodiment of this application;

FIG. 20 is a fourth schematic diagram of an equivalent circuit of a charge pump in a charging stage according to an embodiment of this application; and FIG. 21 is a fourth schematic diagram of an equivalent circuit of a charge pump in a discharging stage according to an embodiment of this application.

DETAILED DESCRIPTION OF THE EMBODIMENTS

A wireless communication-based communication apparatus such as a terminal device (for example, a mobile phone or a tablet computer) and a base station each include an integrated circuit, configured to receive and send a radio frequency signal, to perform wireless communication. For a part of the integrated circuit that transmits a radio frequency signal, to increase a gain of the radio frequency signal, power amplification is to be performed on the radio frequency signal by a PA before the radio frequency signal is transmitted through an antenna. However, the gain of the radio frequency signal increased by using a single PA is limited. Therefore, to further increase the gain of the radio frequency signal, a plurality of PAs may be cascaded to perform power amplification on the radio frequency signal by stages, so that a peak-to-average power ratio (PAPR) of the radio frequency signal can be increased, thereby increasing a peak rate, a capacity, and a bandwidth of a system.

In embodiments of this application, a plurality of cascaded PAs may also be referred to as a plurality of PAs connected in series. To be specific, an output end of a previous PA is coupled to an input end of a next PA. In the plurality of cascaded PAs, a PA other than a last-stage PA may be referred to as a driving-stage PA, and the last-stage PA may be referred to as an output-stage PA. For example, in M cascaded PAs, a first-stage PA to an (M–1)th-stage PA may be referred to as driving-stage PAs, an Mth-stage PA may be referred to as an output-stage PA, where M is an integer greater than or equal to 2. A quantity of the cascaded PAs is not limited in this application, and the plurality of cascaded PAs are not limited to belonging to one group. For example, there may be a plurality of groups of cascaded PAs, and a plurality of cascaded PAs in each group may be coupled to one integrated circuit and one antenna, so that the communication apparatus can support a plurality of integrated circuits and a plurality of antennas. This application is described by using an example in which there is a group of cascaded PAs, but is not intended to be limited thereto.

To improve efficiency of the PA, currently, an independent power supply circuit is used to supply power to the plurality of cascaded PAs, to dynamically regulate a power supply voltage of the PA, and improve the efficiency of the PA. This power supply circuit may also be referred to as a PA supply modulator (PASM). A reason why the efficiency of the PA can be improved by dynamically regulating the power supply voltage of the PA is that transmit power of the PA is varying. A supply voltage required by the PA at a specific moment changes with a change of instantaneous transmit power while ensuring linearity. Therefore, the efficiency of the PA can be improved by dynamically regulating the power supply voltage of the PA.

Because a heterojunction bipolar transistor (HBT) is generally used as a power amplifying tube in the PA, when a power supply voltage of the PA increases, power consumed by the PA also increases, resulting in an increase in a temperature rise of the PA. Because a material of the HBT is generally gallium arsenide (GaAs), which is a thermoelectric positive feedback material, the increase in the temperature rise causes an increase in a current consumed by the PA. In the plurality of cascaded PAs, the output-stage PA consumes a largest current, and the driving-stage PA consumes a current of only tens of micro-amperes. Therefore, a power supply voltage of the output-stage PA is generally dynamically regulated, and a power supply voltage of the driving-stage PA is fixed.

With reference to FIG. 1 to FIG. 4, the following describes a plurality of integrated circuits in which a power supply circuit supplies power to a plurality of cascaded PAs.

Figure 1:
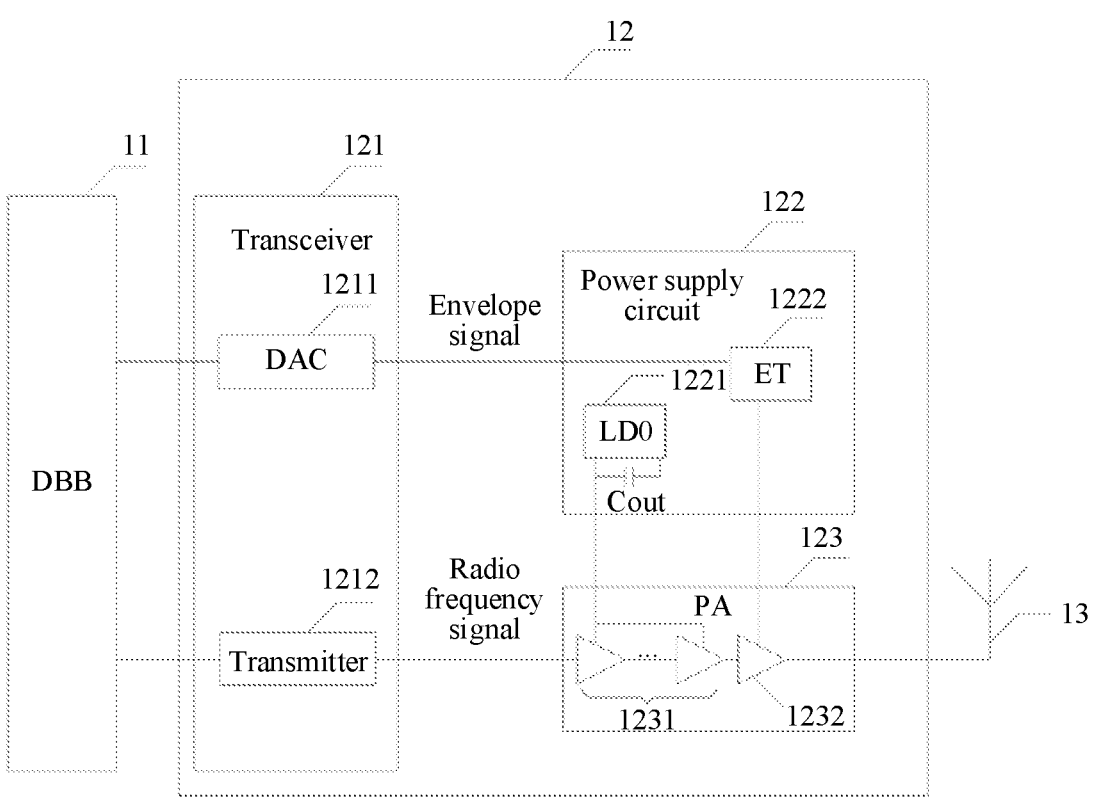
FIG. 1 is a first schematic diagram of a structure of a communication apparatus according to an embodiment of this application.

As shown in FIG. 1, in a possible implementation, a communication apparatus includes a digital baseband (DBB) processor 11, an integrated circuit 12, and an antenna 13. In addition, the communication apparatus may further include a printed circuit board (not shown in the figure), and the communication apparatus (for example, the digital baseband processor 11 and the integrated circuit 12) may be fixed on the printed circuit board.

The integrated circuit 12 may include a transceiver 121, a power supply circuit 122, and a PA 123. The transceiver 121 includes a digital-to-analog converter (DAC) 1211, a transmitter 1212, and a receiver (not shown in the figure). The power supply circuit 122 may be the PASM described above. The power supply circuit 122 includes a (LDO) 1221, a load capacitor Cout, and an envelope tracker (ET) 1222.

The PA 123 may include a plurality of cascaded PAs, for example, the PA 123 may include a driving-stage PA (a non-last stage PA) 1231 and an output-stage PA (a last stage PA) 1232 that are cascaded. An input end of the driving-stage PA 1231 is coupled to an output end of the transmitter 1212. An output end of the driving-stage PA 1231 is coupled to an input end of the output-stage PA 1232. An output end of the output-stage PA 1232 is coupled to the antenna 13.

The following describes functions of the foregoing devices.

The DBB processor 11 is configured to provide an input signal to the DAC 1211 and the transmitter 1212. For example, the DBB processor 11 may provide a low-frequency baseband modulation signal to the transmitter 1212, and provide, to the DAC 1211, an envelope signal that is in a digital form and that corresponds to the baseband modulation signal.

The transmitter 1212 is configured to convert the low-frequency baseband signal into a high-frequency radio frequency signal.

The PA 123 is configured to amplify power of a radio frequency signal output by the transmitter 1212, and transmit the radio frequency signal through the antenna 13.

The DAC 1211 is configured to convert the envelope signal in the digital form provided by the DBB processor 11 into an envelope signal in an analog form.

The ET 1222 is configured to receive the envelope signal output by the DAC 1211, and perform, based on the envelope signal, dynamic regulation on power supplied by the output-stage PA 1232 of the PA 123, thereby improving efficiency of the output-stage PA 1232.

The LDO 1221 is configured to supply power to the driving-stage PA 1231 of the PA 123.

The load capacitor Cout is coupled to an output end of the LDO 1221. As an energy storage device, the load capacitor Cout is configured to improve a transient response of a current output by the LDO 1221, to provide a stable power supply voltage.

Because efficiency of the LDO 1221 decreases as a difference between an input supply voltage and an output power supply voltage increases, efficiency of the power supply circuit 122 is limited. In addition, a current consumed by the driving-stage PA 1231 increases as the input power supply voltage increases. Correspondingly, efficiency of the driving-stage PA 1231 decreases. Therefore, a solution in which the LDO 1221 supplies power to the driving-stage PA 1231 of the PA 123 is used. This limits overall efficiency of the power supply circuit 122 and the PA 123.

Figure 2:
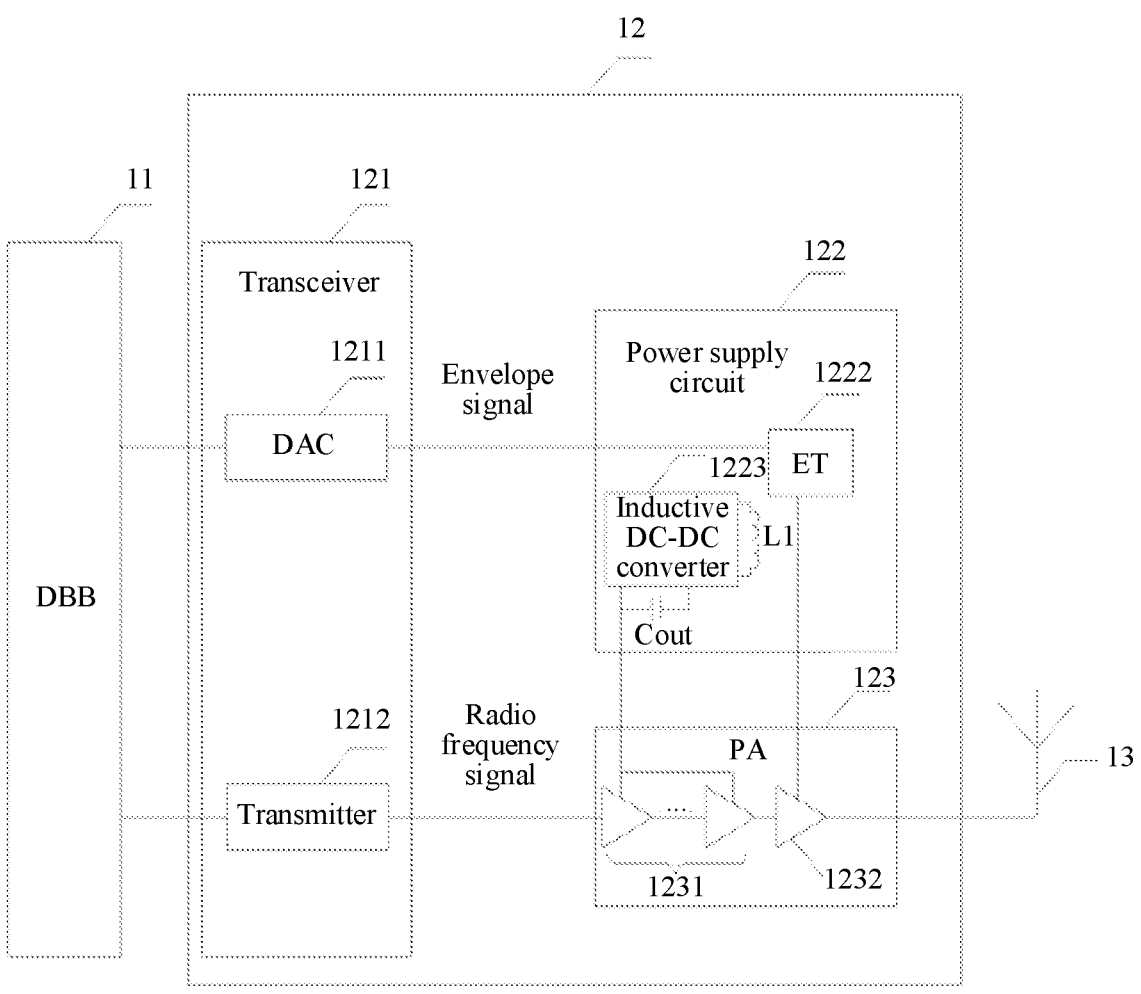
FIG. 2 is a second schematic diagram of a structure of a communication apparatus according to an embodiment of this application.

As shown in FIG. 2, in another possible implementation, different from the integrated circuit in FIG. 1, a power supply circuit 122 includes an inductive direct current-to-direct current (DC-DC) converter 1223, a load capacitor Cout, and a first inductor L1. The first inductor L1 is configured to charge the load capacitor Cout when the inductive DC-DC converter 1223 performs a switching operation. The load capacitor Cout is coupled to an output end of the inductive DC-DC converter 1223. As an energy storage device, the load capacitor Cout is configured to improve a transient response of a current output by the inductive DC-DC converter 1223, to provide a stable power supply voltage. The inductive DC-DC converter 1223 is configured to supply power to a driving-stage PA 1231 of a PA 123. The inductive DC-DC converter 1223 has a theoretical efficiency of 100%, and has a measured efficiency of higher than 90% when an actual switching loss and chip power consumption are considered. Although efficiency of the power supply circuit 122 based on the inductive DC-DC converter 1223 is high, an extra off-chip inductor needs to be added. This increases costs.

Figure 3:
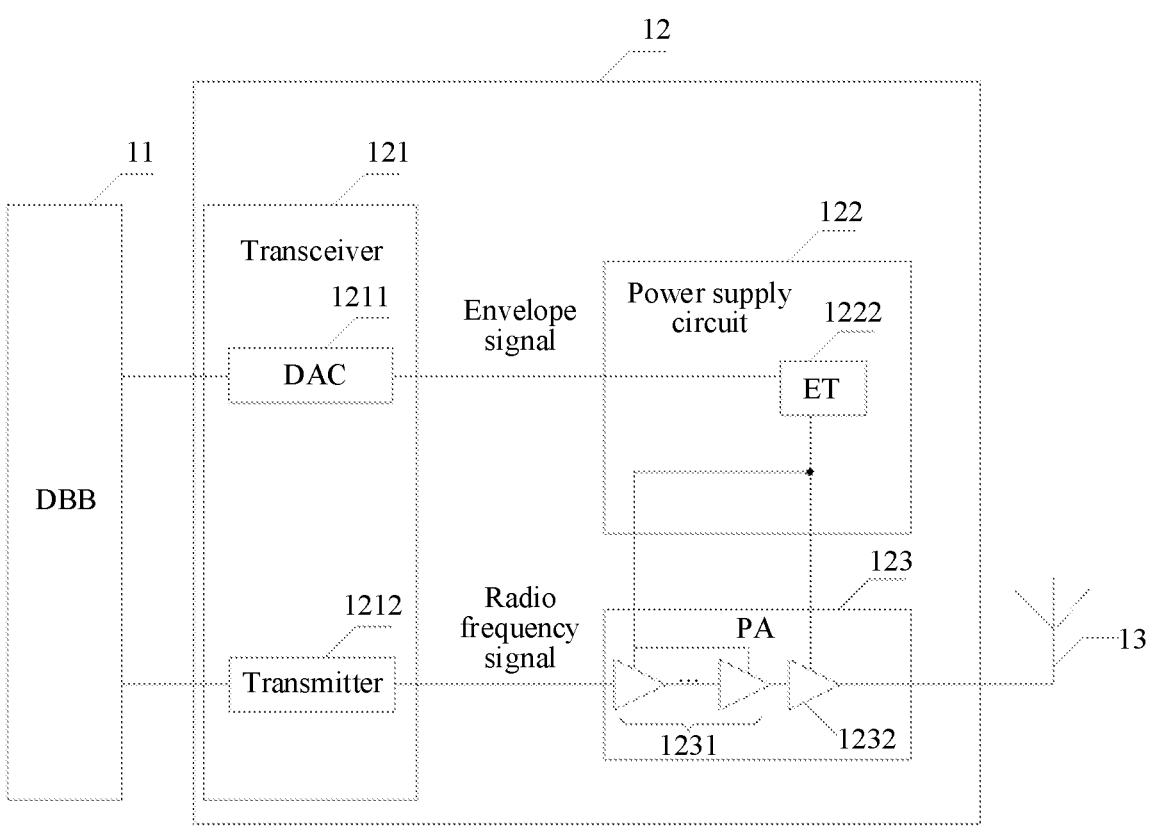
FIG. 3 is a third schematic diagram of a structure of a communication apparatus according to an embodiment of this application.

As shown in FIG. 3, in still another possible implementation, different from the integrated circuits in FIG. 1 and FIG. 2, an ET 1222 in a power supply circuit 122 is further configured to supply power to a driving-stage PA 1231 of a PA 123. In this implementation, a capacitor coupled to a power input end of the driving-stage PA 1231 is also coupled to an output end of the ET 1222. This increases a load capacitance of the ET 1222, decreases efficiency of the ET 1222, and is not conducive to loop stability design because the ET 1222 generally uses a linear amplifier to amplify an input signal, and for an output stage of the linear amplifier, a class AB amplifier is generally used to drive the output-stage PA 1232. A larger load capacitance of the ET 1222 indicates a larger dynamic loss and lower efficiency of the ET 1222. In addition, a larger load capacitance of the ET 1222 indicates a smaller pole of the output end of the ET 1222. This is not conductive to the loop stability design of the linear amplifier in the ET 1222.

Figure 4:
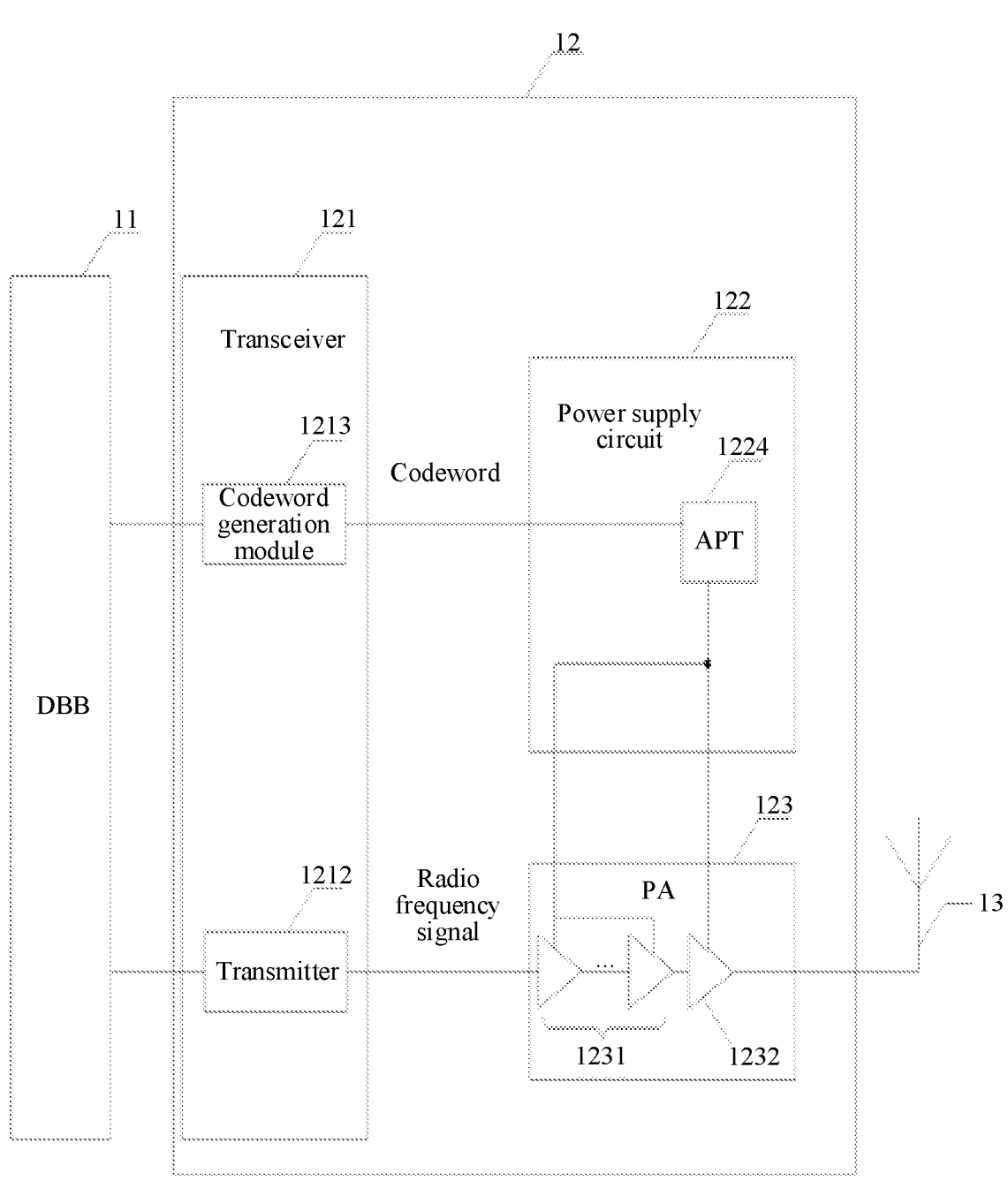
FIG. 4 is a fourth schematic diagram of a structure of a communication apparatus according to an embodiment of this application.

As shown in FIG. 4, in still another possible implementation, different from the integrated circuits in FIG. 1 to FIG. 3, a transceiver 121 includes a codeword generation module 1213, and a power supply circuit 122 includes an average power tracker (APT) 1224.

The codeword generation module 1213 is configured to generate a codeword corresponding to average power of a current subframe of a radio frequency signal. The APT 1224 is configured to supply power to a PA 123 based on the codeword. To be specific, the APT 1224 regulates a power supply voltage of the PA 123 based on average power of subframes of a transmit signal, thereby improving efficiency of the PA 123.

Compared with the solution in FIG. 3 in which the ET 1222 supplies power to the cascaded PA 123, the APT 1224 outputs a fixed power supply voltage in each subframe, without tracking envelope amplitude information about a modulation signal in real time. Therefore, the solution is simple, and usually, a load driving capability of the PA is not limited. When a signal bandwidth is very small, overall efficiency of the APT 1224 and the PA 123 is lower than overall efficiency of the ET 1222 and the PA 123. However, because efficiency of the ET 1222 decreases with an increase of the signal bandwidth, for a bandwidth of higher than 20 M or 40 M, the overall efficiency of the APT 1224 and the PA 123 is generally higher than the overall efficiency of the ET 1222 and the PA 123. In addition, because a power supply voltage required by a driving-stage PA 1231 is generally less than a power supply voltage required by an output-stage PA 1232, providing a same power supply voltage to a plurality of PAs (the driving-stage PA 1231 and the output-stage PA 1232) by using the APT 1224 may cause a decrease in efficiency of the driving-stage PA 1231.

In conclusion, in an existing solution, there is a conflict between efficiency and costs when the power supply circuit supplies power to the driving-stage PA in the plurality of cascaded PAs.

Figure 5:
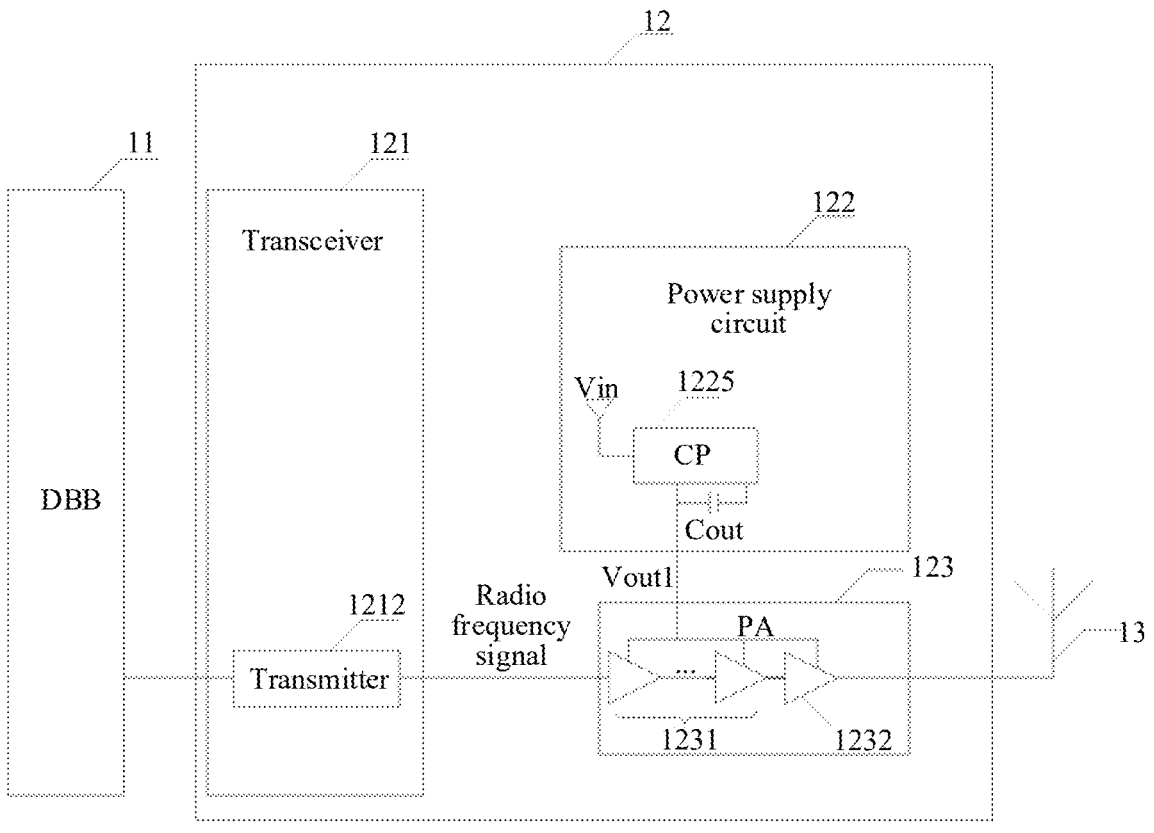
FIG. 5 is a fifth schematic diagram of a structure of a communication apparatus according to an embodiment of this application.

Therefore, an embodiment of this application provides a communication apparatus shown in FIG. 5 to FIG. 8. As shown in FIG. 5, a power supply circuit 122 includes a charge pump (CP) 1225, and the power supply circuit 122 supplies power to a PA 123 by using a CP 1225. To be specific, the CP 1225 converts a supply voltage Vin, to provide a first power supply voltage Vout1 to the PA 123. The PA 123 may include one or more PAs.

Figure 6:
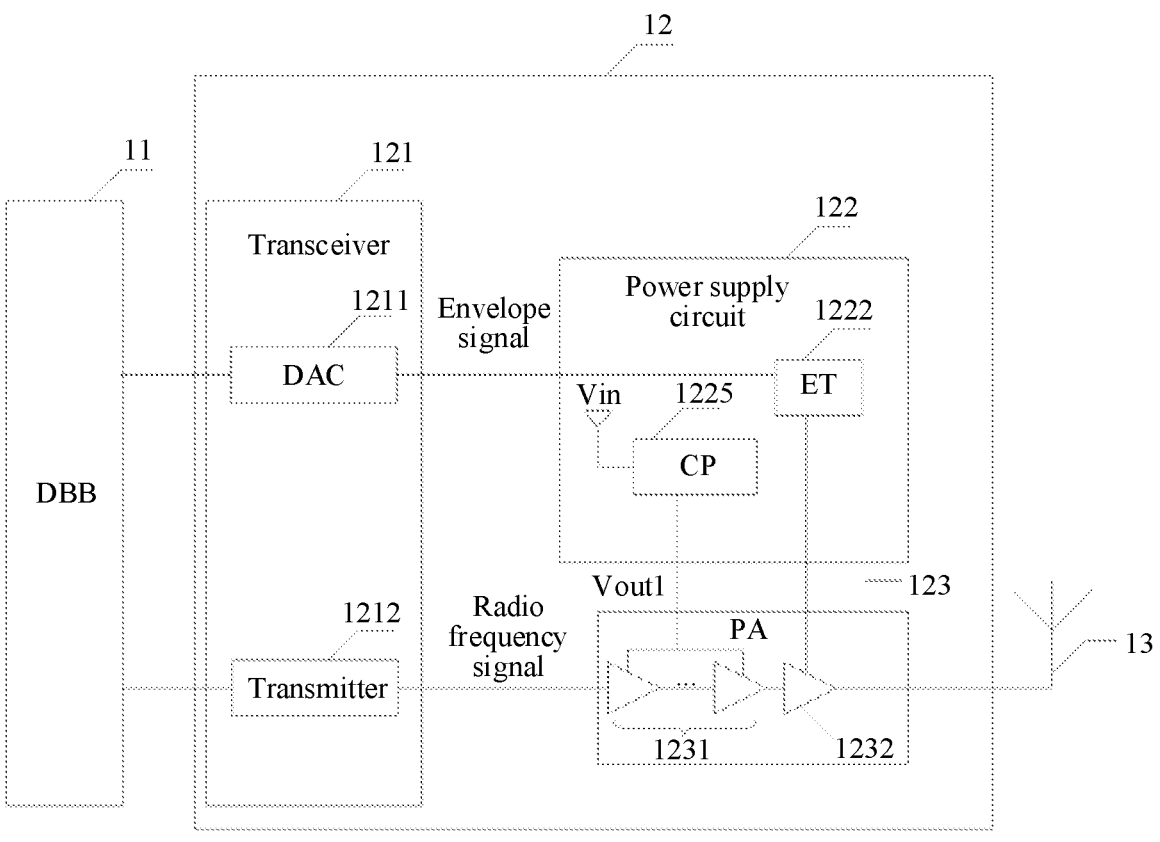
FIG. 6 is a sixth schematic diagram of a structure of a communication apparatus according to an embodiment of this application.

Further, as shown in FIG. 6 to FIG. 8, the power supply circuit 122 may supply power to a driving-stage PA 1231 in the PA 123 by using the CP 1225, and the CP 1225 converts the supply voltage Vin to provide the first power supply voltage Vout1 to the driving-stage PA 1231 in the PA 123. In addition, in FIG. 6, similar to FIG. 1 to FIG. 3, the power supply circuit 122 may supply power to an output-stage PA

1232 by using an ET 1222. To be specific, the ET 1222 performs, based on an envelope signal output by a DAC 1211, dynamic regulation on power supplied by an output-stage PA 1232 in the PA 123. In FIG. 7, similar to FIG. 4, the power supply circuit 122 may supply power to an output-stage PA 1232 by using an APT 1224. To be specific, the APT 1224 performs, based on a codeword, dynamic regulation on power supplied by the output-stage PA 1232 in a cascaded PA 123. In FIG. 8, the power supply circuit 122 further includes an ET 1222, an APT 1224, and a single-pole double-throw switch 1226. The power supply circuit 122 may select, by using the single-pole double-throw switch 1226, the ET 1222 or the APT 1224 to supply power to the output-stage PA 1232. As described above, when the signal bandwidth is very small, the overall efficiency of the APT 1224 and the PA 123 is lower than the overall efficiency of the ET 1222 and the PA 123. However, because the efficiency of the ET 1222 decreases with the increase of the signal bandwidth, for a bandwidth of higher than 20 M or 40 M, the overall efficiency of the APT 1224 and the PA 123 is generally higher than the overall efficiency of the ET 1222 and the PA 123. One of the APT 1224 or the ET 1222 is selected based on the signal bandwidth to supply power to the output-stage PA 1232, so that overall efficiency of the power supply circuit and the PA 123 can be improved under different signal bandwidths.

It should be noted that, for a plurality of groups of cascaded PAs 123, the power supply circuit 122 may supply power to the plurality of groups of cascaded PAs 123 by using the CP 1225. Further, the power supply circuit 122 may supply power to the driving-stage PA 1231 in the plurality of groups of cascaded PAs 123 by using the CP 1225.

Considering that a supply voltage input by the CP fluctuates in practice, and a power supply voltage output by the CP changes accordingly, a transceiver 121 may compensate, according to a digital algorithm, for a change of a gain of the PA caused by a change of the power supply voltage output by the CP, to ensure linearity of output of the PA.

In addition, the power supply circuit 122 may further include a power supply module, for example, an LDO or a DC-DC converter. The power supply module is coupled between the CP 1225 and the driving-stage PA 1231. By using the power supply module, a voltage output by the CP 1225 may be further flexibly regulated and then provided to the driving-stage PA, so that flexibility of power supply is improved.

For functions of other devices in FIG. 5 to FIG. 8, refer to the foregoing descriptions, and details are not described herein again.

Compared with the solutions in FIG. 1 to FIG. 4, the solutions in FIG. 5 to FIG. 8 have the following advantages:

In comparison with the solution in FIG. 1, it is assumed that the LDO and the CP also perform voltage reduction, for example, if an output voltage Vout is equal to a half of an input voltage Vin, efficiency of the CP theory is 100%, and an actual loss is only a turn-on loss and a switching loss of a power switch as well as a control circuit loss, and is irrelevant to the input voltage and the output voltage. However, efficiency of the LDO theory is only 50%. Therefore, supplying power using the CP can achieve a higher efficiency than using the LDO.

In comparison with the solution in FIG. 2, the use of the off-chip inductor (generally a power inductor) may be avoided, and only a specific number of capacitors are added for operating of the CP. These capacitors are generally off-chip ceramic capacitors or on-chip capacitors. Therefore, in comparison with using high-cost power inductors, the costs are greatly reduced, and efficiency of the power supply circuit is improved.

In comparison with the solution in FIG. 3, the load capacitance of the ET is reduced, thereby improving efficiency of the ET and facilitating the loop stability design.

In comparison with the solution in FIG. 4, power is supplied to the driving-stage PA by the CP independently, without by the APT, and therefore, efficiency of the driving-stage PA is not lowered.

In conclusion, according to the communication apparatus and the integrated circuit provided in embodiments of this application, because the theoretical efficiency of the CP is 100%, and the actual loss is small, the CP is used in the power supply circuit to supply power to the PA, so that efficiency of the power supply circuit can be improved.

The following describes a possible structure of the PA 123 with reference to FIG. 9 and FIG. 10.

As shown in FIG. 9 and FIG. 10, a PA 123 includes a driving-stage PA 1231, an output-stage PA 1232, an input matching network circuit 1233, and an output matching network circuit 1234. The driving-stage PA 1231 is configured to input a radio frequency signal output by a transmitter 1212, and output an amplified radio frequency signal. The output-stage PA 1232 is configured to input the radio frequency signal amplified by the driving-stage PA 1231, output a further amplified radio frequency signal, and transmit the amplified radio frequency signal through an antenna 13. The input matching network circuit 1233 is configured to perform impedance matching on an output end of the transmitter 1212. The output matching network circuit 1234 is configured to perform impedance matching on the antenna 13. A difference between FIG. 9 and FIG. 10 lies in that the driving-stage PAs 1231 in FIG. 10 may include a plurality of cascaded PAs.

Structures of the driving-stage PAs 1231 and the output-stage PA 1232 may be identical or different. For example, a first driving-stage PA 1231 may include a capacitor C, a resistor R, a second inductor L2, and a triode VT. A base of the triode VT is coupled to an output end of the input matching network circuit 1233 by using the capacitor C to input a radio frequency signal. The base of the triode VT further inputs a bias voltage Vbias by using the resistor R. An emitter of the triode VT is grounded. A collector of the triode VT inputs a power supply voltage Vout from a power supply circuit (not shown in the figure) by using the second inductor L2, and the collector of the triode VT is further configured to output an amplified radio frequency signal. Bias voltages Vbias input by each PA may be different. The bias voltage Vbias is configured to provide a direct current bias point for the triode VT. The second inductor L2 is configured to perform a choke function on the radio frequency signal, so that an alternating-current signal is completely transmitted to a load without being transmitted to a power supply. The capacitor C is configured to isolate a direct current in the radio frequency signal.

The following describes a possible structure of the ET 1222 with reference to FIG. 11.

As shown in FIG. 11, an ET 1222 includes a switch circuit 101, an envelope amplifier 102, a power supply sub-circuit 103, and a third inductor L3.

The switch circuit 101 may also be referred to as a switching mode power supply (SMPS), and has high efficiency. A voltage input end of the switch circuit 101 inputs a supply voltage Vin. An output end of the switch circuit 101 periodically outputs, to a node A by using the third inductor L3, a first power supply current including a direct current and a low-frequency power component, that is, may supply power to an output-stage PA 1232. The switch circuit 101 may be a boost circuit, a buck circuit, or a buck-boost circuit.

A voltage input end of a power supply sub-circuit 103 inputs the supply voltage Vin, and an output end of the power supply sub-circuit 103 outputs a boosted voltage Vboost higher than the supply voltage Vin, or a bucked voltage Vbuck lower than the supply voltage Vin, or the supply voltage Vin. The power supply sub-circuit 103 may be a boost circuit, a buck circuit, a buck-boost circuit, or may bypass to the supply voltage Vin.

A signal input end of the envelope amplifier 102 inputs an envelope signal. Two voltage input ends of the envelope amplifier 102 respectively input the supply voltage Vin and a voltage V1 provided by the power supply sub-circuit 103. The envelope amplifier 102 receives one of the supply voltage Vin or the voltage V1 as a working voltage. When an amplitude of the envelope signal is large, a higher voltage between the supply voltage Vin and the voltage V1 is selected as the working voltage. When an amplitude of the envelope signal is small, a lower voltage between the supply voltage Vin and the voltage V1 is selected as the working voltage. An output end of the envelope amplifier 102 outputs, to the node A, a second power supply current including a high-frequency power component, and the output end of the envelope amplifier 102 is further configured to output, to the output-stage PA 1232, a second power supply voltage Vout2 following the envelope signal, that is, may supply power to the output-stage PA 1232, so that efficiency of the output-stage PA 1232 can be improved.

The first power supply current and the second power supply current that converge at the node A are output as drive currents to the output-stage PA 1232. In other words, the switch circuit 101 and the envelope amplifier 102 together supply power to the output-stage PA 1232, the switch circuit 101 outputs the first power supply current to the output-stage PA 1232 by using a first inductor L1, and the envelope amplifier 102 outputs, to the output-stage PA 1232, the second power supply current and the second power supply voltage Vout2 following the envelope signal. Because a proportion of the low-frequency power component of an actual envelope is far greater than the high-frequency power component, the switch circuit 101 provides most power of the entire envelope. However, the switch circuit 101 has high efficiency, and therefore, overall efficiency of the ET 1222 can be improved. The envelope amplifier 102 is configured to amplify the input envelope signal by a specific multiple, so that a fast tracking function can be implemented.

The following describes a plurality of possible structures of the CP 1225 with reference to FIG. 12 to FIG. 21. The structure of the CP 1225 is not limited in this application.

In a possible implementation, as shown in FIG. 12, a CP 1225 includes a switch K1, a switch K2, a switch K3, a switch K4, a capacitor C1, and a load capacitor Cout. A first end of the switch K2, a first end of the load capacitor Cout, and a second end of the switch K3 are all coupled to an output end of the CP 1225, and are configured to output a power supply voltage Vout. A second end of the switch K2 is coupled to a first end of the capacitor C1 and a first end of the switch K1. A second end of the switch K1 is coupled to an input end of the CP 1225, and is configured to input a supply voltage Vin. A first end of the switch K4 and a second end of the load capacitor Cout are coupled to each other and grounded. A second end of the switch K4 is coupled to a second end of the capacitor C1 and a first end of the switch K3. As an energy storage device, the load capacitor Cout is configured to improve a transient response of a current output by the CP 1225, to provide a stable power supply voltage.

It should be noted that, in embodiments of this application, a first end of each component is represented by a number "1", and a second end of each component is represented by a number "2".

A working process of the CP includes a periodic charging stage and a periodic discharging stage.

As shown in FIG. 13, in the charging stage, the switch K1 and the switch K3 are closed, and other switches are open, so that a path is formed to enable the capacitor C1 and the load capacitor Cout to be connected in series to the supply voltage Vin for charging, and to further output the power supply voltage Vout. In this case, formula 1 is satisfied:

$$V1+Vout=Vin \qquad\qquad \text{Formula 1}$$

V1 is a stability voltage of the capacitor C1.

As shown in FIG. 14, in the discharging stage, the switch K2 and the switch K4 are closed, and other switches are open, so that a path is formed to enable the capacitor C1 and the load capacitor Cout to be connected in parallel, the supply voltage Vin is disconnected, and the capacitor C1 and the load capacitor Cout output the power supply voltage Vout by discharging. In this case, formula 2 is satisfied:

$$V1=Vout \qquad\qquad \text{Formula 2}$$

In combination with formula 1 and formula 2, it can be learned that Vout=Vin/2. In other words, the power supply voltage Vout output by the CP 1225 is a half of the input supply voltage Vin.

By extending a scenario in which the power supply voltage Vout output by the CP 1225 is a half of the input supply voltage Vin, a scenario in which the power supply voltage Vout output by the CP 1225 is one-(N+1)th of the input supply voltage Vin can be obtained, where N is a positive integer.

It is assumed that the CP 1225 includes a plurality of switches, N capacitors (C1 to Cn), and the load capacitor Cout. The first end of the load capacitor Cout is configured to output the power supply voltage Vout, and the second end of the load capacitor Cout is grounded. In the charging stage, as shown in FIG. 15, the plurality of switches in the CP 1225 operate to enable a first end of a first path formed after the N capacitors are connected in series to be coupled to the first end of the load capacitor Cout, and enable the supply voltage Vin to be input to a second end of the first path formed after the N capacitors are connected in series. In other words, the N capacitors are connected in series and then connected in series to the load capacitor Cout. In this case, the supply voltage Vin charges the N capacitors and the load capacitor Cout (N+1 capacitors in total), and further outputs the power supply voltage Vout. In this case, formula 3 is satisfied:

$$V1+V2+\ldots+Vn+Vout=Vin \qquad\qquad \text{Formula 3}$$

V1 is a stability voltage of the capacitor C1, V2 is a stability voltage of the capacitor C2, Vn is a stability voltage of the capacitor Cn, and Vout is a stability voltage of the load capacitor Cout.

In the discharging stage, as shown in FIG. 16, the plurality of switches in the CP 1225 operate to disconnect the supply voltage Vin, couple a first end of a second path formed after the N capacitors are connected in parallel to the first end of the load capacitor Cout, and enable a second end of the second path formed after the N capacitors are connected in parallel to be grounded. In other words, the N capacitors are connected in parallel and then connected in parallel to the load capacitor Cout, and the N+1 capacitors output the power supply voltage Vout by discharging. In this case, formula 4 is satisfied:

$$V1=V2=\ldots=Vn=Vout \qquad\qquad \text{Formula 4}$$

In combination with formula 3 and formula 4, it can be learned that Vout=Vin/(N+1). In other words, the power supply voltage Vout output by the CP 1225 is one-(N+1)th of the input supply voltage Vin.

A specific structure of the CP 1225 is not limited in this application. It can be learned from the foregoing implementation that, according to the CP 1225 provided in embodiments of this application, a ratio of the output voltage Vout to the input voltage Vin can be flexibly changed by adjusting a quantity of capacitors that perform a serial-to-parallel conversion in the charging stage and the discharging stage, to facilitate regulation of a power supply voltage provided to the PA.

In another possible implementation, as shown in FIG. 17, a CP 1225 may include a switch K1, a switch K2, a switch K3, a switch K4, a switch K5, a switch K6, a switch K7, a capacitor C1, a capacitor C2, and a load capacitor Cout. A second end of the switch K1 is coupled to a second end of the switch K5 and is configured to input a supply voltage Vin. A first end of the switch K1 is coupled to a second end of the switch K2 and a first end of the capacitor C1. A first end of the switch K2 is coupled to a first end of the load capacitor Cout, a first end of the switch K3, and a first end of the switch K7, and is configured to output a power supply voltage Vout. A second end of the load capacitor Cout is grounded. A second end of the switch K3 is coupled to a second end of the capacitor C1 and a first end of the switch K4. A second end of the switch K4 is coupled to a first end of the switch K5 and a first end of the capacitor C2. A second end of the capacitor C2 is coupled to a second end of the switch K7 and a first end of the switch K6. A second end of the switch K6 is grounded.

A working process of the CP includes a periodic charging stage and a periodic discharging stage.

As shown in FIG. 18, in the charging stage, the switch K1, the switch K3, the switch K5, and the switch K7 are closed, and other switches are open, so that a path is formed to enable the capacitor C1 and the capacitor C2 to be connected in parallel and then connected in series to the load capacitor Cout to be connected to the supply voltage Vin for charging, and further output the power supply voltage Vout. In this case, formula 5 is satisfied:

$$V1+Vout=V2+Vout=Vin \qquad\qquad \text{Formula 5}$$

As shown in FIG. 19, in the discharging stage, the switch K2, the switch K4, and the switch K6 are closed and other switches are open, so that a path is formed to enable the capacitor C1 and the capacitor C2 to be connected in series and then connected in parallel to the load capacitor Cout, the supply voltage Vin is disconnected, and the capacitor C1, the capacitor C2, and the load capacitor Cout output the power supply voltage Vout by discharging. In this case, formula 6 is satisfied:

$$V1+V2=Vout \qquad\qquad \text{Formula 6}$$

In combination with formula 5 and formula 6, it can be learned that Vout=2Vin/3. In other words, the power supply voltage Vout output by the CP 1225 is two-thirds of the input supply voltage Vin.

By extending a scenario in which the power supply voltage Vout output by the CP 1225 is two-thirds of the input supply voltage Vin, a scenario in which the power supply voltage Vout output by the CP 1225 is N/(N+1)th of the input supply voltage Vin can be obtained, where N is a positive integer.

It is assumed that the CP 1225 includes a plurality of switches, N capacitors (C1 to Cn), and the load capacitor Cout. The first end of the load capacitor Cout is configured to output the power supply voltage Vout, and the second end of the load capacitor Cout is grounded. In the charging stage, as shown in FIG. 20, a plurality of switches in the CP 1225 operate to enable a first end of a first path formed after the N capacitors are connected in parallel to be coupled to the first end of the load capacitor Cout, and enable the supply voltage Vin to be input to a second end of the first path formed after the N capacitors are connected in parallel. In other words, the N capacitors are connected in parallel and then connected in series to the load capacitor Cout. In this case, the supply voltage Vin charges the N capacitors and the load capacitor Cout (N+1 capacitors in total), and further outputs the power supply voltage Vout. In this case, formula 7 is satisfied:

$$V1+Vout=V2+Vout= \ldots =Vn+Vout=Vin \qquad \text{Formula 7}$$

V1 is a stability voltage of the capacitor C1, V2 is a stability voltage of the capacitor C2, Vn is a stability voltage of the capacitor Cn, and Vout is a stability voltage of the load capacitor Cout.

In the discharging stage, as shown in FIG. 21, a plurality of switches in the CP 1225 operate to disconnect the supply voltage Vin, couple a first end of a second path, formed after the N capacitors are connected in series, to the first end of the load capacitor Cout, and enable a second end of the second path, formed after the N capacitors are connected in series, to be grounded. In other words, the N capacitors are connected in series and then connected in parallel to the load capacitor Cout, and the N+1 capacitors output the power supply voltage Vout by discharging. In this case, formula 11 is satisfied:

$$V1+V2+ \ldots +Vn=Vout \qquad \text{Formula 11}$$

In combination with formula 10 and formula 11, it can be learned that Vout=Vin*N/(N+1). In other words, the power supply voltage Vout output by the CP 1225 is N/(N+1)th of the input supply voltage Vin.

A specific structure of the CP 1225 is not limited in this application. It can be learned from the foregoing implementation that, according to the CP 1225 provided in embodiments of this application, a ratio of the output voltage Vout to the input voltage Vin can be flexibly changed by adjusting a quantity of capacitors that perform a serial-to-parallel conversion in the charging stage and the discharging stage, to facilitate regulation of a power supply voltage provided to the PA.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A power supply circuit configured to be coupled to a power amplifier comprising a driving-stage power amplifier and an output-stage power amplifier, wherein the power amplifier is configured to amplify a power of a radio frequency signal, the driving-stage power amplifier is configured to receive the radio frequency signal, and the output-stage power amplifier is configured to receive a radio frequency signal amplified by the driving-stage power amplifier, the power supply circuit comprising:

a charge pump configured to supply power to the driving-stage power amplifier; and an envelope tracker configured to supply power to the output-stage power amplifier, wherein the charge pump and the envelope tracker are configured to supply power to the power amplifier, wherein the charge pump comprises a first switch, a second switch, a third switch, a fourth switch, a first capacitor, and a load capacitor, a first end of the second switch, a first end of the load capacitor, and a second end of the third switch are all coupled to an output end of the charge pump, a second end of the second switch is coupled to a first end of the first capacitor and a first end of the first switch, a second end of the first switch is coupled to an input end of the charge pump, a first end of the fourth switch and a second end of the load capacitor are coupled to each other and coupled to a ground node, and a second end of the fourth switch is coupled to a second end of the first capacitor and a first end of the third switch.

2. The power supply circuit according to claim 1, wherein the envelope tracker comprises:

a switch circuit configured to output a low-frequency power component to the output-stage power amplifier; and an envelope amplifier configured to output a high-frequency power component to the output-stage power amplifier.

3. The power supply circuit according to claim 1, wherein:

the power supply circuit further comprises an average power tracker; and the power supply circuit is configured to select the average power tracker or the envelope tracker to supply power to the output-stage power amplifier.

4. The power supply circuit according to claim 1, wherein the charge pump is configured to provide a power supply voltage that is one-(N+1)th of an input voltage, and N is a positive integer.

5. The power supply circuit according to claim 1, wherein the charge pump is configured to provide a voltage that is N/(N+1)th of an input voltage, and N is a positive integer.

6. A system comprising the power supply circuit and the power amplifier of claim 1.

7. A communication apparatus, comprising:

a digital baseband processor;

a transmitter coupled to the digital baseband processor;

a power amplifier coupled to the transmitter, the power amplifier comprising a driving-stage power amplifier and an output-stage power amplifier, wherein the power amplifier is configured to amplify a power of a radio frequency signal provided by the transmitter, the driving-stage power amplifier is configured to receive the radio frequency signal, and the output-stage power amplifier is configured to receive a radio frequency signal amplified by the driving-stage power amplifier; and a power supply circuit coupled to the power amplifier, the power supply circuit comprising:

a charge pump configured to supply power to the driving-stage power amplifier, and an envelope tracker configured to supply power to the output-stage power amplifier, wherein the charge pump and the envelope tracker are configured to supply power to the power amplifier, wherein:

the charge pump comprises a first switch, a second switch, a third switch, a fourth switch, a first capacitor, and a load capacitor, a first end of the second switch, a first end of the load capacitor, and a second end of the third switch are all coupled to an output end of the charge pump, a second end of the second switch is coupled to a first end of the first capacitor and a first end of the first switch, a second end of the first switch is coupled to an input end of the charge pump; a first end of the fourth switch and a second end of the load capacitor are coupled to each other and coupled to a ground node, and a second end of the fourth switch is coupled to a second end of the first capacitor and a first end of the third switch.

8. The communication apparatus according to claim 7, wherein:

the power amplifier comprises a third capacitor, a resistor, an inductor, and a triode; and a base of the triode is configured to receive the radio frequency signal using the third capacitor, the base of the triode is further configured to receive a bias voltage using the resistor, an emitter of the triode is coupled to a ground node, a collector of the triode is configured to receive a power supply voltage from the power supply circuit using the inductor, and the collector of the triode is further configured to output an amplified radio frequency signal.

9. The communication apparatus according to claim 7, further comprising a printed circuit board and an antenna, wherein the communication apparatus is fixed on the printed circuit board, and the power amplifier is configured to transmit an amplified radio frequency signal through the antenna.

10. The communication apparatus according to claim 7, wherein the envelope tracker comprises:

a switch circuit configured to output a low-frequency power component to the output-stage power amplifier; and an envelope amplifier configured to output a high-frequency power component to the output-stage power amplifier.

11. The communication apparatus according to claim 7, wherein the power supply circuit further comprises an average power tracker configured to select the average power tracker or the envelope tracker to supply power to the output-stage power amplifier.

12. The communication apparatus according to claim 7, wherein the charge pump is configured to provide a power supply voltage that is one-(N+1)th of an input voltage, and N is a positive integer.

13. The communication apparatus according to claim 7, wherein the charge pump is configured to provide a voltage output that is N/(N+1)th of an input voltage, and N is a positive integer.

14. A method of operating a power amplifier comprising a driving-stage power amplifier, and an output-stage power amplifier having an input coupled to an output of the driving-stage power amplifier, the method comprising:

supplying power, by a charge pump, to the driving-stage power amplifier; and supplying power, by an envelope tracker, to the output-stage power amplifier, wherein:

the charge pump comprises a first switch, a second switch, a third switch, a fourth switch, a first capacitor, and a load capacitor, a first end of the second switch, a first end of the load capacitor, and a second end of the third switch are all coupled to an output end of the charge pump, a second end of the second switch is coupled to a first end of the first capacitor and a first end of the first switch, a second end of the first switch is coupled to an input end of the charge pump; a first end of the fourth switch and a second end of the load capacitor are coupled to each other and coupled to a ground node, and a second end of the fourth switch is coupled to a second end of the first capacitor and a first end of the third switch.

15. The method of claim 14, further comprising:

providing, by a switch circuit of the envelope tracker, a low-frequency power component to the output-stage power amplifier; and providing, by an envelope amplifier, a high-frequency power component to the output-stage power amplifier.

16. The method of claim 14, further comprising:

tracking, by an average tracker, an average power of a radio frequency signal provided to the power amplifier; and selecting one of an output of the average tracker or an output of the envelope tracker to supply power to the output-stage power amplifier.

17. The method of claim 16, wherein tracking the average power of the radio frequency signal comprises receiving a codeword corresponding to the average power of the radio frequency signal.

18. The method of claim 14, further comprising:

receiving a first radio frequency signal by the driving-stage power amplifier;

amplifying the received first radio frequency signal by the driving-stage power amplifier to provide a first amplified radio frequency signal; and amplifying, by the output-stage power amplifier, the first amplified radio frequency signal to provide a second amplified radio frequency signal.

19. The method of claim 14, wherein supplying power to the driving-stage power amplifier comprises providing a power supply voltage that is one-(N+1)th of an input voltage, and N is a positive integer.

20. The method of claim 14, wherein supplying power to the driving-stage power amplifier comprises providing a voltage that is N/(N+1)th of an input voltage, and N is a positive integer.

* * * * *